(12) United States Patent
Diest et al.

(10) Patent No.: US 11,396,586 B1
(45) Date of Patent: Jul. 26, 2022

(54) POLYMER MATERIALS INCLUDING COATED NANOVOIDS AND METHODS AND SYSTEMS FOR FORMING THE SAME

(71) Applicant: Facebook Technologies, LLC, Menlo Park, CA (US)

(72) Inventors: Kenneth Diest, Kirkland, WA (US); Andrew John Ouderkirk, Redmond, WA (US); Renate Eva Klementine Landig, Seattle, WA (US); Spencer Allan Wells, Seattle, WA (US); Katherine Marie Smyth, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 229 days.

(21) Appl. No.: 16/512,335

(22) Filed: Jul. 15, 2019

Related U.S. Application Data

(60) Provisional application No. 62/777,825, filed on Dec. 11, 2018.

(51) Int. Cl.
*C08J 9/28* (2006.01)
*G02B 27/01* (2006.01)
(Continued)

(52) U.S. Cl.
CPC .............. *C08J 9/286* (2013.01); *C08J 9/0061* (2013.01); *C08J 9/04* (2013.01); *G02B 1/041* (2013.01);
(Continued)

(58) Field of Classification Search
CPC ... C08J 9/286; C08J 9/04; C08J 9/0061; C08J 2475/04; C08J 2325/06; C08J 2201/05;
(Continued)

(56) References Cited

U.S. PATENT DOCUMENTS

| 3,215,583 A | 11/1965 | Holme |
| 3,985,599 A | 10/1976 | Lepoutre et al. |

(Continued)

FOREIGN PATENT DOCUMENTS

| CA | 2737458 A1 | 3/2010 |
| EP | 0807459 A1 | 11/1997 |
| WO | 2011088161 A1 | 7/2011 |

OTHER PUBLICATIONS

Notice of Allowance received for U.S. Appl. No. 16/262,439 dated Apr. 6, 2021, 38 pages.

(Continued)

*Primary Examiner* — Kara B Boyle
(74) *Attorney, Agent, or Firm* — FisherBroyles LLP

(57) ABSTRACT

A nanovoided polymer-based material may include a bulk polymer material defining a plurality of nanovoids and an interfacial film disposed at an interface between each of the plurality of nanovoids and the bulk polymer material. The interfacial film may include one or more layers of material. A method of forming a nanovoided polymer-based material may include (1) forming a bulk polymer material defining a plurality of nanovoids and (2) forming an interfacial film at an interface between each of the plurality of nanovoids and the bulk polymer material. Various other methods, systems, and materials are also disclosed.

7 Claims, 14 Drawing Sheets

(51) Int. Cl.
| | |
|---|---|
| *G02B 1/04* | (2006.01) |
| *G06F 3/01* | (2006.01) |
| *C08J 9/04* | (2006.01) |
| *C08J 9/00* | (2006.01) |
| *H02N 1/00* | (2006.01) |
| *G02B 3/12* | (2006.01) |

(52) U.S. Cl.
CPC ......... *G02B 27/0172* (2013.01); *G06F 3/014* (2013.01); *G06F 3/016* (2013.01); *H02N 1/006* (2013.01); *C08J 2201/05* (2013.01); *C08J 2205/04* (2013.01); *C08J 2205/042* (2013.01); *C08J 2325/06* (2013.01); *C08J 2333/00* (2013.01); *C08J 2463/00* (2013.01); *C08J 2475/04* (2013.01); *C08J 2479/02* (2013.01); *C08J 2483/04* (2013.01); *G02B 3/12* (2013.01); *G02B 2027/0178* (2013.01)

(58) Field of Classification Search
CPC .............. C08J 2205/042; C08J 2333/00; C08J 2205/04; C08J 2463/00; C08J 2483/04; C08J 2479/02; G06F 3/016; G06F 3/014; G02B 1/041; G02B 27/0172; G02B 2027/0178; G02B 3/12; H02N 1/006
See application file for complete search history.

(56) References Cited

U.S. PATENT DOCUMENTS

| | | |
|---|---|---|
| 4,613,544 A | 9/1986 | Burleigh |
| 5,095,515 A | 3/1992 | Seaver |
| 6,420,441 B1 | 7/2002 | Allen et al. |
| 6,488,721 B1 | 12/2002 | Carlson |
| 6,628,850 B1 | 9/2003 | Yao |
| 7,002,754 B2 | 2/2006 | Baer et al. |
| 7,230,771 B2 | 6/2007 | Kuiper et al. |
| 8,477,402 B2 | 7/2013 | Duncan et al. |
| 8,564,181 B2 | 10/2013 | Choi et al. |
| 8,848,280 B2 | 9/2014 | Arsenault |
| 9,228,822 B2 | 1/2016 | Majidi et al. |
| 9,820,481 B2 * | 11/2017 | Hani ..................... A01N 43/68 |
| 9,923,180 B2 | 3/2018 | Thomas-Alyea et al. |
| 10,670,782 B2 | 6/2020 | Arbabi et al. |
| 10,690,946 B2 | 6/2020 | Wilson |
| 10,749,448 B2 | 8/2020 | Lindsay et al. |
| 10,797,217 B2 | 10/2020 | Hakkens et al. |
| 11,022,856 B1 | 6/2021 | Ouderkirk et al. |
| 11,025,175 B1 | 6/2021 | Landig et al. |
| 2002/0009251 A1 | 1/2002 | Byrne |
| 2002/0135863 A1 | 9/2002 | Fukshima et al. |
| 2002/0186928 A1 | 12/2002 | Curtis |
| 2005/0007675 A1 | 1/2005 | Matsumoto et al. |
| 2005/0196552 A1 | 9/2005 | Lehmann et al. |
| 2006/0024976 A1 | 2/2006 | Waldfried et al. |
| 2006/0028734 A1 | 2/2006 | Kuiper et al. |
| 2007/0020404 A1 | 1/2007 | Seiberle et al. |
| 2007/0205398 A1 | 9/2007 | Smela et al. |
| 2007/0263963 A1 | 11/2007 | Hughes et al. |
| 2008/0137031 A1 | 6/2008 | Hillis et al. |
| 2008/0171431 A1 | 7/2008 | Yu et al. |
| 2008/0197518 A1 | 8/2008 | Aylward et al. |
| 2008/0224103 A1 | 9/2008 | Arsenault et al. |
| 2009/0034051 A1 | 2/2009 | Arsenault et al. |
| 2009/0296188 A1 | 12/2009 | Jain et al. |
| 2010/0075056 A1 | 3/2010 | Axisa et al. |
| 2011/0149410 A1 | 6/2011 | Blum |
| 2011/0242638 A1 | 10/2011 | Horning et al. |
| 2012/0019185 A1 | 1/2012 | Guidarelli et al. |
| 2012/0029416 A1 | 2/2012 | Parker et al. |
| 2012/0200931 A1 | 8/2012 | Haag et al. |
| 2012/0211261 A1 | 8/2012 | Aabloo et al. |
| 2012/0298200 A1 | 11/2012 | Niggemann et al. |
| 2013/0176628 A1 | 7/2013 | Batchko et al. |
| 2013/0202867 A1 | 8/2013 | Coggio et al. |
| 2013/0222881 A1 | 8/2013 | Aizenberg et al. |
| 2013/0279151 A1 | 10/2013 | Ouderkirk et al. |
| 2013/0335807 A1 | 12/2013 | Arsenault et al. |
| 2014/0133010 A1 | 5/2014 | Han et al. |
| 2014/0204372 A1 | 7/2014 | Pang et al. |
| 2014/0217539 A1 | 8/2014 | Rantala |
| 2014/0234995 A1 | 8/2014 | Li et al. |
| 2014/0266647 A1 | 9/2014 | Visitacion et al. |
| 2014/0312737 A1 | 10/2014 | Jenninger et al. |
| 2014/0323603 A1 | 10/2014 | Kolb et al. |
| 2014/0326292 A1 | 11/2014 | Yordem et al. |
| 2015/0109657 A1 | 4/2015 | Baumberg et al. |
| 2015/0205126 A1 | 7/2015 | Schowengerdt |
| 2015/0241698 A1 | 8/2015 | Schowengerdt |
| 2015/0259493 A1* | 9/2015 | Nederkoorn ........... C08J 9/0061 521/97 |
| 2015/0315012 A1 | 11/2015 | Wiersma et al. |
| 2016/0036353 A1 | 2/2016 | Stasik et al. |
| 2016/0103341 A1 | 4/2016 | Long |
| 2016/0187985 A1 | 6/2016 | Lim et al. |
| 2016/0283773 A1 | 9/2016 | Popovich et al. |
| 2017/0023807 A1 | 1/2017 | Chang-Hasnain et al. |
| 2017/0031078 A1 | 2/2017 | Thompson et al. |
| 2017/0090570 A1 | 3/2017 | Rain et al. |
| 2017/0192595 A1 | 7/2017 | Choi et al. |
| 2017/0285348 A1 | 10/2017 | Ayres et al. |
| 2017/0365630 A1 | 12/2017 | Yang |
| 2018/0093456 A1 | 4/2018 | Van Overmeere et al. |
| 2018/0164627 A1 | 6/2018 | Oh |
| 2018/0356303 A1 | 12/2018 | Li et al. |
| 2019/0296218 A1 | 9/2019 | Ouderkirk et al. |
| 2019/0361318 A1 | 11/2019 | Johnson et al. |
| 2020/0076328 A1 | 3/2020 | Cha et al. |
| 2020/0183168 A1 | 6/2020 | Spann et al. |
| 2020/0183199 A1 | 6/2020 | Diest et al. |
| 2020/0183200 A1 | 6/2020 | Diest et al. |
| 2020/0185590 A1 | 6/2020 | Malhotra et al. |

OTHER PUBLICATIONS

Notice of Allowance received for U.S. Appl. No. 16/351,477 dated Mar. 29, 2021, 28 pages.
Non-Final Office Action received for U.S. Appl. No. 16/364,977 dated Oct. 19, 2020, 38 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci. 42130, 2015, 17 pages.
Struzynska-Piron et al., "Synthesis of solvent stable polymeric membranes via UV depth-curing", Chem. Commun., vol. 49, 11494, 2013, 3 pages.
Preinterview first office action received for U.S. Appl. No. 16/262,433 dated Oct. 26, 2020, 58 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Correa D.M., et al., "Negative Stiffness Honeycombs for Recoverable Shock Isolation," Rapid Prototyping Journal, Mar. 16, 2015, vol. 21 (2), pp. 193-200, Retrieved from the Internet: URL: www.emeraldinsight.com/1355-2546.htm.
Ren X., et al., "Design and Characterisation of a Tuneable 3D Buckling-Induced Auxetic Metamaterial," Materials and Design, Feb. 5, 2018, vol. 139, pp. 336-342.

(56) References Cited

OTHER PUBLICATIONS

U.S. Appl. No. 16/262,439, filed Jan. 30, 2019, U.S. Appl. No. 16/262,433, filed Jan. 30, 2019, U.S. Appl. No. 16/263,829, filed Jan. 31, 2019.

Mullin et al., "Pattern Transformation Triggered by Deformation", Physical Review Letters, vol. 99, No. 8, 2007, 4 pages.

Babaee et al., "3D Soft Metamaterials with Negative Poisson's ratio", Advanced Materials, vol. 25, No. 36, 2013, 18 pages.

Bertoldi et al., "Novel negative Poisson's ratio behavior induced by an elastic instability", Advanced Materials, vol. 22, No. 3, 2010, pp. 1-11.

Overvelde et al., "Relating pore shape to the non-linear response of periodic elastomeric structures", Journal of the Mechanics and Physics of Solids, vol. 64, 2014, 16 pages.

Shen et al., "Simple cubic three-dimensional auxetic metamaterials", Physic Status Solidi (B), vol. 251, No. 8, 2014, pp. 1515-1522.

Correa et al., "Negative Stiffness Honeycombs for Recoverable Shock Isolation", Rapid Prototyping Journal, vol. 21, No. 2, 2015, pp. 702-713.

Coulais et al., "Discontinuous Buckling of Wide Beams and Metabeams", Physical Review Letters, vol. 115, 2015, 7 pages.

Bickel et al., "Design and Fabrication of Materials with Desired Deformation Behavior", ACM Transactions on Graphics (TOG), vol. 29, No. 4, Jul. 2010, 10 pages.

Rosset et al., "Small, fast, and tough: Shrinking down integrated elastomer transducers", Applied Physics Reviews, vol. 3, No. 3, 2016, pp. 1-27.

Plante et al., "Large-scale failure modes of dielectric elastomer actuators", International Journal of Solids and Structures, vol. 43, 2006, pp. 7727-7751.

"Optotune DEAPs", Electroactive polymers, URL: https://www.optotune.com/technology/electroactive-polymers, 2019, 3 pages.

Product—Novasentis, "EMP Haptic Actuators For Sensory Innovation", URL: https://www.novasentis.com/product, 2019, 4 pages.

Rosset et al., "Mechanical characterization of a dielectric elastomer microactuator with ion-implanted electrodes", Sensor and Actuators A 144, 2008, 25 pages.

Gerratt et al., "Dielectric breakdown of PDMS thin films", Journal of Micromechanics and Microengineering, vol. 23, Apr. 26, 2013, 8 pages.

Hunt et al., "A self-healing dielectric elastomer actuator", Applied Physics Letters, vol. 104, 2014, 4 pages.

Skov et al., "Optimization Techniques for Improving the Performance of Silicone-Based Dielectric Elastomers", Advanced Engineering Materials, vol. 20, 2018, pp. 1-21.

Mazurek et al., "Glycerol as high-permittivity liquid filler in dielectric silicone elastomers", Journal of Applied Polymer Science, vol. 133, No. 43, 2016, 28 pages.

Rao et al., "Synthesis of flexible silica aerogels using methyltrimethoxysilane (MTMS) precursor", Journal of Colloid and Interface Science, vol. 300, 2006, pp. 279-285.

Seo et al., "Reticulated Nanoporous Polymers by Controlled Polymerization-Induced Microphase Separation", Science, vol. 336, Jun. 15, 2012, 5 pages.

Jennings, S.G., "The mean free path in air", Journal of Aerosol Science, vol. 19, No. 2, 1988, pp. 1-2.

Gupta et al., "Nanoemulsions: formation, properties and applications", Soft Matter, 2016, 16 pages.

Helgeson et al., "Mesoporous organohydrogels from thermogelling photocrosslinkable nanoemulsions", Nature Materials, vol. 11, Apr. 2012, pp. 344-352.

Guha et al., "Creating nanoscale emulsions using condensation", Nature Communications, vol. 8, No. 1371, Nov. 8, 2017, pp. 1-7.

Meier et al., "Microemulsion elastomers", Colloid Polymer Science, vol. 274, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.

Matyka et al., "How to Calculate Tortuosity Easily?", AIP Conference Proceedings, Mar. 26, 2012, 6 pages.

Cheng et al., "Controlled in Situ Nanocavitation in Polymeric Materials", Advanced Materials, vol. 23, Jan. 2011, pp. 409-413.

Solans et al., "Nano-emulsions: Formation by low-energy methods", Colloid & Interface Science, vol. 17, Issue 5, Oct. 2012, pp. 246-254.

Fuse et al., "Possible Mechanism of Superior Partial-Discharge Resistance of Polyamide Nanocomposites", Annual Report Conference on Electrical Insulation and Dielectric Phenomena, 2004, pp. 322-325.

Wu et al., "3D Printed Silicones with Shape Memory", Scientific Reports, vol. 7, No. 4664, Jul. 5, 2017, pp. 1-6.

Johnson et al., "A brief review of atomic layer deposition:from fundamentals to applications", Materials Today, vol. 17, No. 5, Jun. 2014, pp. 236-246.

Sole et al., "Nano-emulsions prepared by the phase inversion composition method: Preparation variables and scale up", Journal of Colloid and Interface Science, vol. 344, 2010, pp. 417-423.

Camino et al., "Polydimethylsiloxane thermal degradation Part 1. Kinetic aspects", Polymer, vol. 42, 2001, pp. 2395-2402.

Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.

Shir, Daniel Jay-Lee et, "Three-Dimensional Nanofabrication with Elastomeric Phase Masks", PhD Thesis, University of Illinois at Urbana-Champaign, Oct. 17, 2007, 138 pages.

Fratzl et al., "The mechanics of tessellations—bioinspired strategies for fracture resistance", Chem Soc Rev., vol. 15, No. 2, Jan. 21, 2016, pp. 252-267.

Gohtani et al., "Nano-Emulsions; Emulsification Using Low Energy Methods", Japan Journal of Food Engineering, vol. 15, No. 3, Sep. 1, 2014, pp. 119-130.

Michler et al., "The physics and micro-mechanics of nano-voids and nano-particles in polymer combinations", ScienceDirect, Polymer, vol. 54, No. 13, Jun. 7, 2013, pp. 1-14.

Zhu et al., "Large deformation and electromechanical instability of a dielectric elastomer tube actuator", Journal of Applied Physics, vol. 108, Issue 7, Article 074113, Oct. 13, 2010, pp. 1-6.

Cameron et al., "Linear actuation in coextruded dielectric elastomer tubes", ScienceDirect, Sensors and Actuators A Physical, vol. 147, Issue 1, Sep. 15, 2008, pp. 286-291.

Catmull et al., "Recursively generated B-spline surfaces on arbitrary topological meshes", Computer-Aided Design, vol. 10, No. 6, Nov. 1, 1978, pp. 183-188.

Loop, Charles Teorell, "Smooth Subdivision Surfaces Based on Triangles", Thesis, Master of Science, University of Utah, Aug. 1, 1987, 74 pages.

Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.

Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.

Cruz-Hernandez et al., "Phase Control Approach to Hysteresis Reduction", IEEE Transactions on Control Systems Technology, vol. 9, No. 1, Jan. 1, 2001, pp. 17-26.

Zuev, Yu.S., "Elastomer-gas systems", International Polymer Science and Technology, vol. 28, No. 2, Feb. 1, 2001, pp. 43-53.

Moore, Duncan T., "Gradient Index Optics", Optical Elements, IVPV Handbook of Optics, 2nd Edition, vol. II—Devices, Measurements, and Properties, 1995, pp. 9.1-9.10.

Nguyen et al., "Synthesis, Processing, and Characterization of Inorganic-Organic Hybrid Cross-Linked Silica, Organic Polyimide,

(56) References Cited

OTHER PUBLICATIONS and Inorganic Aluminosilicate Aerogels", National Aeronautics and Space Administration STI Program, NASA/CR-2014-218328, Jul. 2014, 58 pages.
Shaiz, Narkis, "Gradient-Index Optics", Science Applications International Corp., Final Report, Mar. 31, 2010, 103 pages.
Teichman et al., "Gradient Index Optics at DARPA", Institute for Defense Analyses, IDA Document D-5027, Nov. 2013, 69 pages.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldem et al., "Digilens Switchable Bragg grating waveguide optics for augmented reality applications", Proc. SPIE 10676, Digital optics for Immersive Displays, May 21, 2018, 1 page.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911 filed May 21, 2019, 138 pages.
Landig et al., "Fabrication Of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable BRAGG Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", NANO Letters, vol. 8, No. 1, Jan. 1, 2008, pp. 281-286.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
International Search Report and Written Opinion received for PCT Application Serial No. PCT/US2019/064367 dated Mar. 11, 2020, 17 pages.
Sharma et al., "Switchable Electroactive Devices for Head-Mounted Displays", U.S. Appl. No. 16/351,477 filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.

Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop an Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion". Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. EI-15, No. 3, Jun. 1980, pp. 206-224.
Non-Final Office Action received for U.S. Appl. No. 16/351,477 dated Jun. 23, 2020, 27 pages.
Notice of Allowance received for U.S. Appl. No. 16/703,291 dated Jun. 3, 2021, 61 pages.
Final Office Action received for U.S. Appl. No. 16/262,433 dated May 25, 2021, 30 pages.
Wilson et al., "Variable Wave Plate via Tunable Form-Birefringent Structures", Journal of Microelectromechanical Systems, vol. 17, No. 4, Aug. 2008, pp. 1039-1046.
International Preliminary Report on Patentability received for PCT Application Serial No. PCT/US2019/064395 dated Jun. 24, 2021, 10 pages.
International Preliminary Report on Patentability received for PCT Application Serial No. PCT/US2019/064367 dated Jun. 24, 2021, 10 pages.

* cited by examiner

POLYMER MATERIALS INCLUDING COATED NANOVOIDS AND METHODS AND SYSTEMS FOR FORMING THE SAME

CROSS-REFERENCE TO RELATED APPLICATION

This application is a non-provisional utility application which claims the benefit of U.S. Provisional Application No. 62/777,825 filed 11 Dec. 2018, the disclosure of which is incorporated, in its entirety, by this reference.

BACKGROUND

The field of engineered polymers represents a broad class of materials with tunability in terms of material properties, such as thermal, mechanical, and electrical properties. Unfortunately, traditional polymer materials may be limited in their range of tunability and applicability for use in various emerging technologies. For example, conventional polymers may demonstrate inadequate or inconsistent performance in certain actuator and sensor devices. Additionally, traditional polymers may be prone to dielectric breakdown in various use scenarios. Accordingly, it would be advantageous to provide improved polymer-based materials having improved performance, versatility, tunability, and resistance to dielectric breakdown in a variety of applications.

SUMMARY

As will be described in greater detail below, the instant disclosure relates to nanovoided polymer materials having coated nanovoids and corresponding devices, systems, and methods. According to various embodiments, a nanovoided polymer material may include (i) a bulk polymer material defining a plurality of nanovoids, and (ii) an interfacial film of a plurality of interfacial films disposed at an interface between each of the plurality of nanovoids and the bulk polymer material, the interfacial film including one or more layers of material.

In some embodiments, the interfacial film may include a material that is the same as or differs from the bulk polymer material. In various examples, the interfacial film may include a plurality of layers, two or more of the plurality of layers including a different material. According to at least example, each of the plurality of nanovoids may be spherical or anisotropic in shape. In various examples, at least one of the bulk polymer material or the interfacial film may include at least one of a silicon-based polymer, an acrylic polymer, an epoxy polymer, a polyurethane polymer, a styrene-based polymer, or a polyamine-based polymer.

In various embodiments, the interfacial film may include at least one of a metal, an oxide, a nitride, a surfactant, a fluorocarbon, or a fluorophore. A porosity of the nanovoided polymer material be from greater than 0% to approximately 75%. At least one of the bulk polymer material or the interfacial film may include a nanocomposite having nanoparticles embedded in a polymer.

A corresponding method of forming a nanovoided polymer material may include (i) forming a bulk polymer material defining a plurality of nanovoids, and (ii) forming an interfacial film of a plurality of interfacial films at an interface between each of the plurality of nanovoids and the bulk polymer material, the interfacial film including one or more layers of material.

In some embodiments, the method may further include preparing a mixture including a solvent and a curable component. In this example, forming the bulk polymer material may include (i) curing the curable component to form the bulk polymer material defining a plurality of solvent regions including the solvent, and (ii) removing at least a portion of the solvent from the plurality of solvent regions via a change in at least one of pressure or temperature to form the plurality of nanovoids. Preparing the mixture may include depositing the mixture by at least one of inkjet printing, chemical vapor deposition, vapor coating, spin coating, dip coating, spray coating, or extrusion.

In additional embodiments, the method may further include preparing a mixture including a curable component and a cavitation agent. In this example, the bulk polymer material may be formed by (i) exposing the mixture to a form of actinic radiation sufficient to cure the curable component and decompose the cavitation agent to form the bulk polymer material defining a plurality of defined regions including the one or more decomposition products of the cavitation agent, and (ii) removing at least a portion of the one or more decomposition products from the plurality of defined regions to form the plurality of nanovoids.

According to some embodiments, the interfacial film may be formed by alternately diffusing each of a plurality of atomic layer deposition precursors through the bulk polymer material to adsorb layers of each of the plurality of atomic layer deposition precursors on inner surfaces of each of the plurality of nanovoids.

According to at least one embodiment, the method may further include preparing a mixture including at least one solvent, a first curable component, and a second curable component. In this example, the bulk polymer material may be formed by curing the first curable component. Additionally, the interfacial film may be formed by curing the second curable component. The first curable component may be cured prior to, during, and/or following curing of the second curable component. At least one of the first curable component or the second curable component may include at least one of an acrylate, an ether, an allyl glycidyl ether, an acrylamide, a polyamine, an isocyanate, a fatty acid, a fatty acid ester, a styrene, an epoxy, or a sulfur compound.

In various embodiments, a method of producing an NVP material may include (i) preparing an emulsion including a polymer-forming phase surrounding a dispersed phase that is distributed in a plurality of dispersed-phase regions, (ii) curing the polymer-forming phase to form a bulk polymer material surrounding the plurality of dispersed-phase regions, (iii) removing at least a portion of the dispersed phase from the plurality of dispersed-phase regions to form the plurality of nanovoids, and (iv) forming an interfacial film of a plurality of interfacial films at an interface between each of the plurality of nanovoids and the bulk polymer material, the interfacial film including one or more layers of material.

According to some examples, preparing the emulsion may include forming the emulsion via at least one of phase inversion, cavitation, high-pressure homogenization, ultra-sonication, or vapor condensation. In various embodiments, the emulsion may include at least one of a surfactant, a protein, and a lipid surrounding each of the plurality of dispersed-phase regions. In at least one example, the polymer-forming phase may include a solution of a solvent and a curable component. In this example, the dispersed phase may include a non-solvent that is insoluble in the solvent.

Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
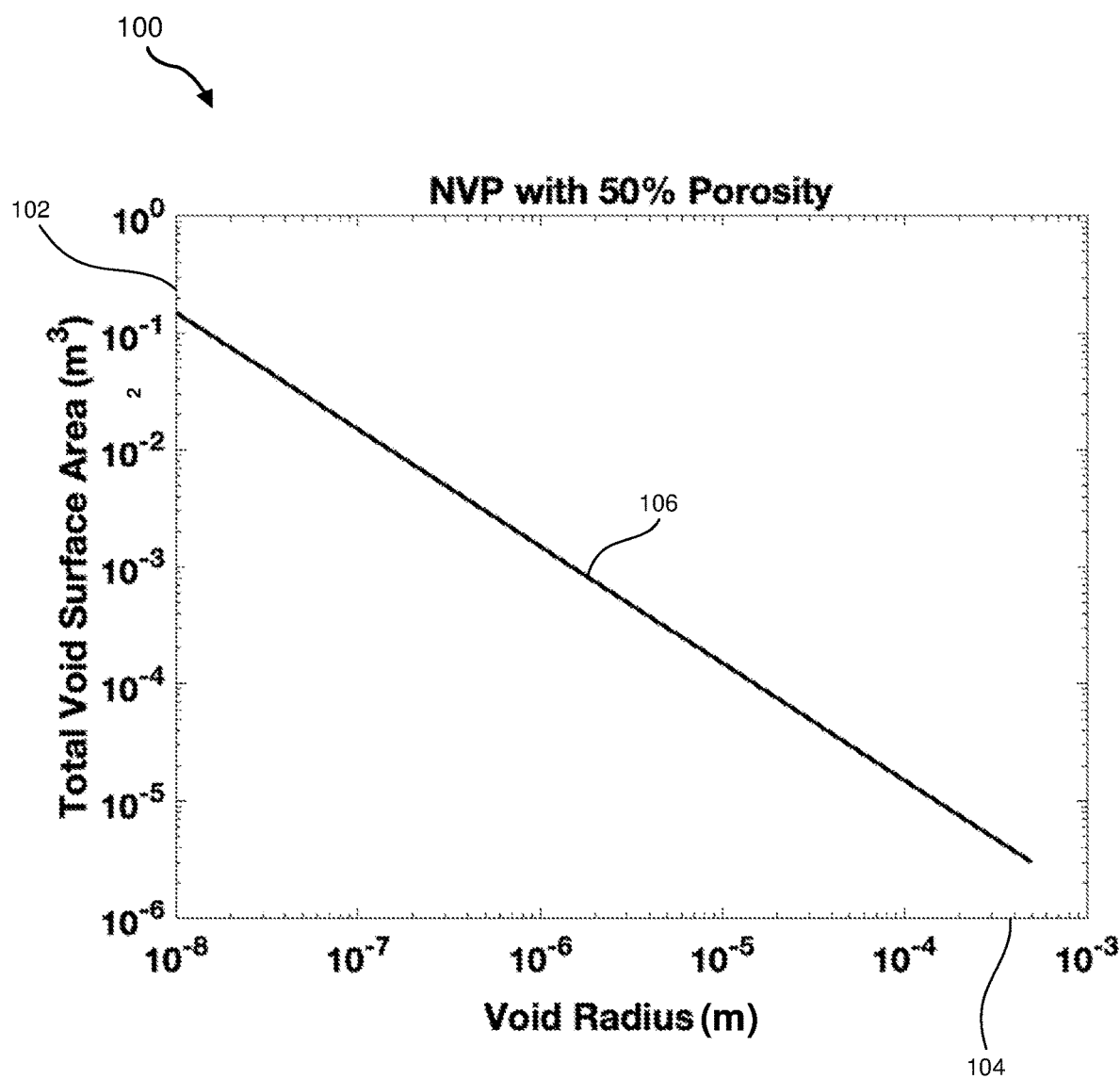
FIG. 1 shows a graph illustrating an exemplary relationship between the radius of an individual nanovoid and the total surface of all nanovoids in a given amount of material when the porosity of the NVP is fixed according to some embodiment.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to nanovoided polymer (NVP) materials having coated nanovoids and corresponding devices, systems, and methods. In various embodiments, the nanovoids may be coated with interfacial films, which may include one or more layers and/or materials, disposed at an interface between each of the plurality of nanovoids and the bulk polymer material. The interfacial films may be selected to advantageously enable tuning and/or optimization of various properties of the NVP materials.

In at least one embodiment, a "nanovoided material," as used herein, may refer to a bulk material containing fluid (e.g., gas, liquid) filled pores (i.e., voids or nanovoids) that are between about 10 and about 1000 nm in average diameter and which may include an interfacial film of one or more layers formed at an interface between the pores and bulk material. The diameters of the nanovoids may be complex to measure in some systems (e.g., in bi-continuous structures). For nanovoided materials, the size of the nanovoids may be estimated by measuring the porosity of the material by any suitable technique. Non-limiting techniques may include, but not be limited to, measuring the compressibility of the nanovoided material, performing dynamic light scattering on the material to determine average nanovoid size, performing X-ray tomography, transmission electron microscopy (TEM), atomic force microscopy (AFM), index of refraction measurements, scanning electron microscopy (SEM), combinations thereof, and/or the like. The nanovoid structure in these materials may, in certain embodiments, be closed cell, where individual nanovoids are isolated from each other. In another embodiment, the nanovoid structure may include open cells, where nanovoids may be in contact with each other and create a direct pathway for fluid to move into and out of the nanovoided material.

As used herein, the terminology "nanovoids," "nanoscale voids," "nanovoided," and the like, may refer to voids having at least one sub-micron dimension, i.e., a length and/or width and/or depth, of less than 1000 nm. In some embodiments, the void size (e.g., average diameter) may be between approximately 5 nm and approximately 1000 nm (e.g., approximately 5 nm, approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In some embodiments, the terminology "interfacial film" and "interfacial layer," as used herein, may refer to a film or layer including one or more layers of material that are either similar or dissimilar and that reside at the interface between two dissimilar materials. The total thickness of the interfacial films can be between one atomic layer and the radius of the void or nanovoid. In the case of irregularly shaped voids, the maximum layer thickness may be that which will fill the entire void.

NVP materials that do not include interfacial films between the nanovoids and the bulk polymer matrix may be limited in terms of overall performance of the NVP materials based on the fact that the macroscopic properties may reside somewhere between that of the bulk polymer material and the gas and/or other material (e.g., solvent) that fills the nanovoids. While various polymer materials, including NVP materials, may be modified through, for example, dispersal of solid particles (e.g., inorganic particles) into the bulk polymer matrix, such approaches may be limited in terms of the materials that might be used based on compatibility of the materials. Additionally, such inorganic materials may not take advantage of the multiple benefits of a voided polymer.

NVP materials having coated nanovoids, as disclosed herein, may provide advantageous improvements over conventional materials and/or may address various problems of conventional materials, including the above-mentioned challenges, via the introduction of an additional material as an interfacial film at a boundary between each of the gas-filled nanovoids and the bulk polymer material.

Figure 8:
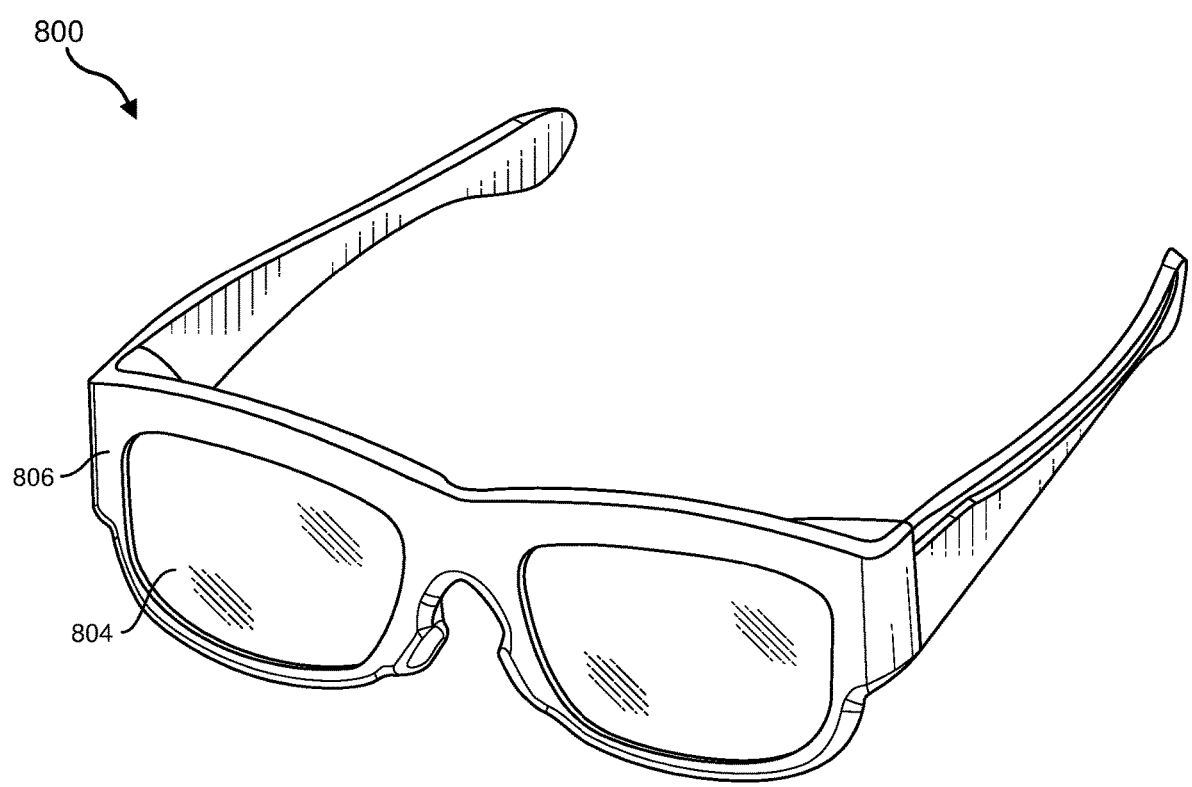
FIG. 8 is an illustration of an example head-mounted device that may be used in connection with embodiments of this disclosure.
Figure 9:
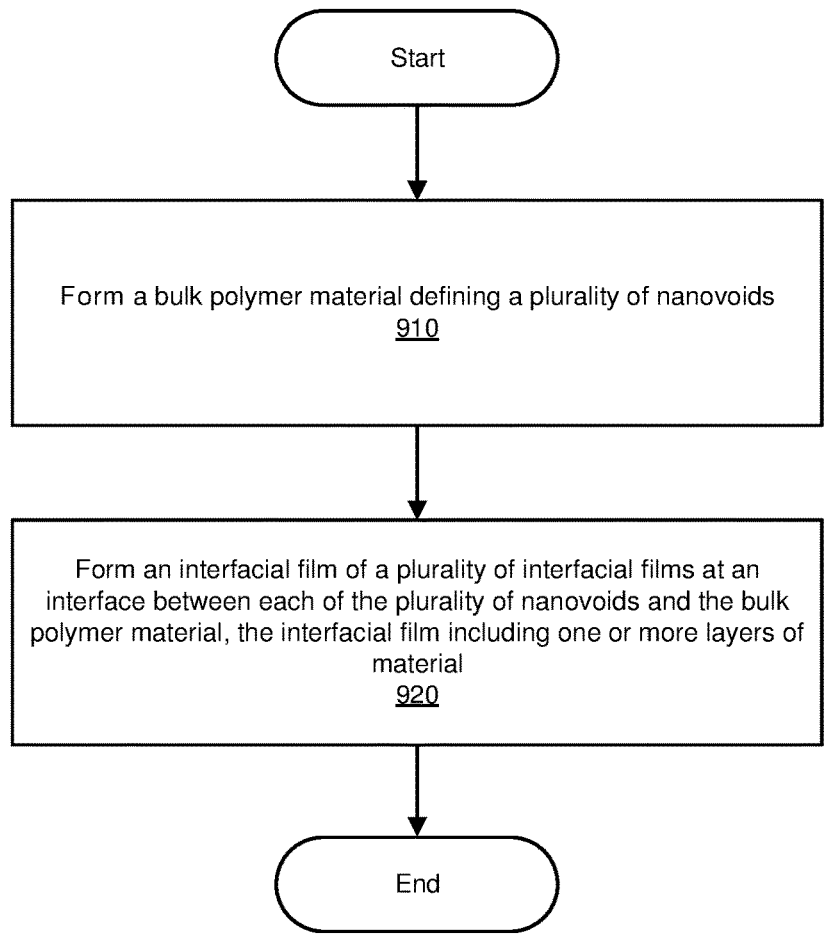
FIG. 9 is a flow diagram of an example method of forming a nanovoided polymer material according to some embodiments.
Figure 10:
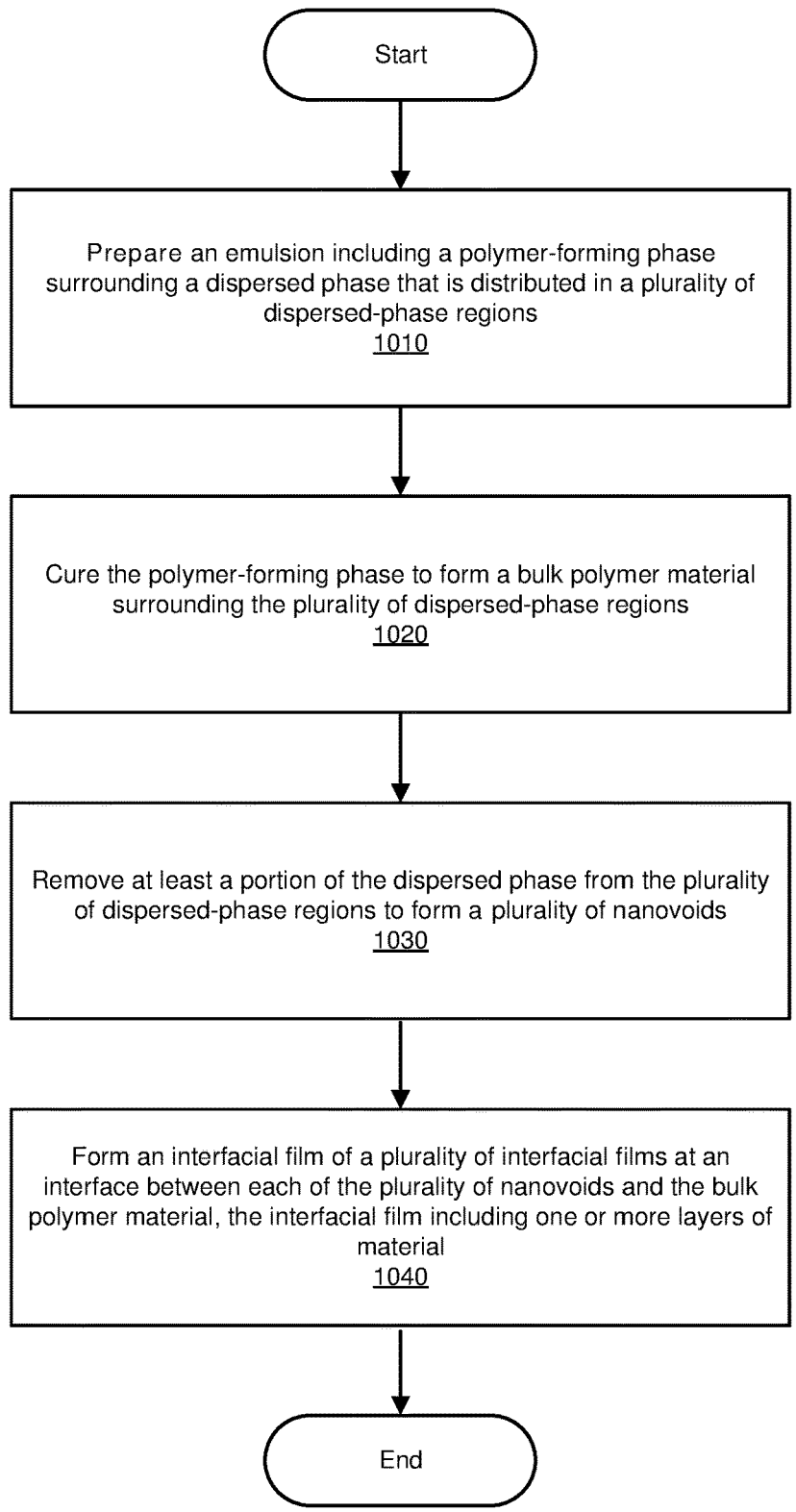
FIG. 10 is a flow diagram of an example method of forming a nanovoided polymer material according to some embodiments.

The following will provide, with reference to FIGS. 1-14, detailed descriptions of NVP materials, systems and apparatuses including NVP materials, and methods for manufacturing NVP materials. The discussion associated with FIGS. 1-5 includes detailed descriptions of NVP materials and processes for forming NVP materials, in accordance with various embodiments. With reference to FIGS. 6-8, detailed descriptions of devices and systems including NVP materials are provided. With reference to FIGS. 9 and 10, detailed descriptions of methods for fabrication of NVP materials are provided. The discussion associated with FIGS. 11-14 provides detailed descriptions of various artificial-reality systems. While many of the examples discussed herein may be directed to artificial reality systems, embodiments of the instant disclosure may be implemented in a variety of different types of devices and systems.

In various embodiments, for an NVP material having a fixed volume fraction of voids and/or nanovoids with respect to the bulk polymer material, as the individual void radius decreases from the millimeter range to the nanometer range, the total surface area of all the nanovoids in the NVP material may increase by multiple orders of magnitude. This surface area scaling effect may present an opportunity to significantly change the macroscopic properties of NVP materials by engineering the physical interactions at the nanovoid/bulk polymer material interfaces.

FIG. 1 shows a graph 100 illustrating an example relationship between the radius of an individual nanovoid and the total surface area of all nanovoids in a given amount (e.g., volume) of NVP material when the porosity of the NVP material is fixed, in accordance with some embodiments of the disclosure. In particular, graph 100 includes a y-axis 102 that represents the total surface of all nanovoids (in square meters) in a given amount of NVP material, and an x-axis 104 representing the individual nanovoid radius (in meters) of each of the nanovoids in the NVP material. In the case represented in graph 100, the calculation was done for an NVP material having a porosity of 50%. Line 106 illustrates that, as the individual nanovoid radius decreases from the millimeter range to the nanometer range, the total surface area of all the nanovoids in the NVP material increases by four orders of magnitude. As a result, interfacial effects may play an increasingly large role on macroscopic performance of NVP materials as the sizes of the nanovoids decrease. Accordingly, significant changes to the macroscopic properties of NVP materials may be obtained by engineering physical interactions in and/or on interfacial films located at interfaces between the nanovoids and the bulk polymer material, with such changes to the properties being most pronounced in NVP materials having relatively smaller nanovoids. This surface area scaling effect may allow for selective sizing of nanovoids and use of interfacial films in NVP materials to obtain desired macroscopic properties.

In at least one embodiment, the addition of interfacial films to an NVP material, as disclosed herein, may improve the dielectric breakdown performance of the NVP material. Initial improvements in dielectric breakdown performance can be achieved by the introduction of nanovoids that are defined within and distributed throughout the bulk polymer material to produce an NVP material. This inclusion of nanovoids may increase the tortuosity of plasma discharge paths through the NVP material. The dielectric breakdown performance may be further improved via the introduction of interfacial films in the nanovoids. In this case, the interfacial films may, for example, modify the charge balance and available charge for discharge near the interfacial films via methods including, for example, the introduction of shallow and deep-level trap states within the NVP material and the redistribution of ionic species to screen out charge imbalances at the interfacial film/bulk polymer interfaces.

In additional embodiments, interfacial films, as disclosed herein, may have a different solubility and/or diffusivity (with respect to gases in the nanovoids) than a bulk polymer material of an NVP material. As such, the interfacial films may act to inhibit or enhance the diffusion of gases into and out of the nanovoids under expansion or compression of the nanovoids.

In some embodiments, disclosed interfacial films may have different mechanical properties (e.g., Young's modulus, creep rate, toughness, tan delta [δ], Poisson's ratio, etc.), optical properties (e.g., refractive index, reflectance, transparency, scattering, absorption, degree of birefringence, etc.), thermal properties (e.g., thermal conductivity), electrical properties (e.g., resistivity, dielectric breakdown strength, and/or dielectric constant, etc.), chemical properties (e.g., etch rate, diffusion constant, solubility, etc.), and/or other macroscopic material properties than a bulk polymer material of an NVP material. Accordingly, the interfacial films can be used to tune one or more mechanical and/or optical properties of the overall NVP material.

In various embodiments, disclosed interfacial films may have a lower surface energy than a bulk polymer material of an NVP material. When the NVP material is compressed and two surfaces of a nanovoid and/or interfacial film coating the nanovoid are placed in contact, stiction between the two surfaces can be reduced or prevented by the inclusion of the interfacial film. In contrast, the bulk polymer material alone may have a higher surface energy such that uncoated surfaces of nanovoids defined therein may exhibit a greater degree of stiction when placed in contact with each other such that the surfaces may have a tendency to adhere to each other, either temporarily or permanently. Examples of interfacial films that may decrease surface energies within nanovoids include fluorocarbons and/or surfactants.

In certain embodiments, disclosed interfacial films coating nanovoids in an NVP material may be formed into regular shapes, such as spheres, obolids, and/or any other suitable shapes. In some examples, an interfacial film material may be formed into shapes and sizes that are ultimately attained within nanovoids during a coated NVP material fabrication process, as disclosed herein, prior to inclusion in a bulk polymer material. For example, nanoparticles including an interfacial film material or precursors thereof may be introduced into a polymer-forming phase used to form the bulk polymer material. However, when nanoparticles are added to a bulk polymer matrix through, for example, an additive process with no voiding process, there may be a solubility limit to the amount of material that can be added before the nanoparticles either cluster together or start to precipitate out of the bulk polymer solution (e.g., on the order of 5-10%). With the nanovoiding processes disclosed herein, the fraction of overall material that can be interfacial film coated nanovoids defined in the bulk material may be much higher (e.g., anywhere between 0 and approximately 75%, such as greater than 10% up to approximately 75%).

In at least one embodiment, disclosed interfacial films may be used to fine-tune sizes of nanovoids defined in an NVP material. For example, by selectively controlling the thicknesses of interfacial films in the nanovoids, nanovoids of a given size may be modified to reduce the final dimensions of the nanovoids, or interior volumes of the nanovoids, that are filled with a fluid (e.g., a gas), by a controlled amount.

In additional embodiments, where the interfacial films have different thermal properties than a gas in the nanovoids or the bulk polymer material, the interfacial films can be used to tune the thermal performance of the NVP material (e.g., by adjusting the overall thermal insulative and/or conductive properties of the NVP material).

In some embodiments, there may be a solubility gap between nanoparticles of a given material (e.g., an interfacial film material, a sacrificial material used to form nanovoids, etc.) and a polymer-forming phase (e.g., a curable and/or polymerizable solution) used to form a bulk polymer material of an NVP material. In such cases, nanoparticles of the given material may tend to fall out of the polymer-forming phase before cross-linking or other curing occurs. Using an interfacial film coating method, as disclosed herein, precursor gases and/or solutions may be introduced to form interfacial films in the NVP material so as to effectively increase the range of materials that can be incorporated together as bulk polymer materials and interfacial film materials.

In various embodiments, NVP materials having interfacial films coating interior surfaces of a bulk polymer material defining nanovoids can be used as a chemical sensor (i.e., an "artificial nose"). Here, the material used as the interfacial films can be selected based on chemical compatibility with a gas species of interest. The interfacial films can be selected such that the gas species of interest selectively binds to the interfacial films, whereas other gas species will not, as a gas mixture is passed through the NVP material. This technique can be used for a variety of applications, including, for example, chemical sensing and enabling selective chemical reactions within the nanovoids. Post-exposure sensing of the chemical species of interest can be done by, for example, exposing the NVP material to ultraviolet (UV) or other light, in which case the gas species of interest bound to the interfacial films will re-radiate light whereas other gas species will not. This may be accomplished by, for example, introducing a fluorophore, which also selectively binds to the gas species of interest, either as part of the interfacial films before exposure to the gas species of interest or as a separate step after exposure to the gas species of interest. Additionally or alternatively, post-exposure sensing of the chemical species of interest may be accomplished by detecting the binding of the gas species of interest to the interfacial films via, for example, a change in the NVP material, such as a change in one or more of a rate of gas diffusion, electrical breakdown, and/or a mass of the NVP material. In additional examples, post-exposure sensing of the chemical species of interest may be done by detecting a new resonance in a microscopy spectrum using suitable techniques, such as Fourier-transform infrared spectroscopy (FTIR) or Raman spectroscopy, to identify the presence of the gas species of interest bound to the interfacial films.

In another embodiment, the chemical selectivity of NVP materials that include interfacial films, as described herein, may additionally or alternatively be utilized for selective gas capture without sensing of the captured gas. In this case, for example, the NVP having interfacial films may be used for gas filtration by selectively pulling out one gas species from a mixture of two or more gas species as the mixture is passed through the NVP/interfacial film system of the NVP material. The selectively removed (i.e., filtered) gas species may, for example, be selectively bound to the interfacial films.

In some embodiments, the chemical selectivity of NVP materials that include interfacial films, as described herein, may be utilized for purposes of selective chemical reactions or catalysis. For example, the interfacial films may be engineered to selectively bond and react with gaseous species that are flowed through the NVP/interfacial film system of the NVP material. The reaction can occur spontaneously or with the addition of an external source, such as heat and/or actinic radiation (e.g., visible light, UV light, x-ray radiation, gamma radiation, and/or electron radiation).

In NVP materials, the nanovoids may be randomly distributed throughout the bulk polymer matrix without exhibiting any long-range order, or the nanovoids may exhibit a regular, periodic structure having a lattice constant of, for example, approximately 20 nm to approximately 100 µm. In both disordered and ordered structures, the nanovoids may be discrete, closed-celled voids, open-celled voids that may be at least partially interconnected, or combinations thereof. For open-celled voids, the void size may be the minimum average diameter of the cell. The voids may be any suitable size and, in some embodiments, the voids may approach the scale of the thickness of the NVP material. In some embodiments, the NVP material may have a thickness of approximately 5 nm to approximately 10 µm (e.g., approximately 5 nm, approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5

μm, approximately 6 μm, approximately 7 μm, approximately 8 μm, approximately 9 μm, or approximately 10 μm, including ranges between any of the foregoing values), with an example thickness of approximately 200 nm to approximately 500 nm.

In certain embodiments, the nanovoids may occupy from greater than 0% to approximately 75% by volume of the NVP material (e.g., approximately 5%, approximately 10%, approximately 20%, approximately 30%, approximately 40%, approximately 50%, approximately 60%, approximately 70%, or approximately 75%, including ranges between any of the foregoing values). Further, the size range for the nanovoids (e.g., the polydispersity of the nanovoids) may vary within a factor of about 100× or less (e.g., approximately 100×, approximately 90×, approximately 80×, approximately 70×, approximately 60×, approximately 50×, approximately 45×, approximately 40×, approximately 35×, approximately 30×, approximately 25×, approximately 20×, approximately 15×, approximately 10×, approximately 5×, or less).

According to some embodiments, the nanovoids may be substantially spherical, although the void shape is not particularly limited. For instance, in addition to or in lieu of spherical voids, the NVP material may include voids that are spheroid, ellipsoid, oblate, prolate, lenticular, ovoid, disc-like shapes, etc., and may be characterized by convex and/or concave cross-sectional shapes. Moreover, the topology of the voids throughout the bulk polymer matrix may be uniform or non-uniform. As used herein, "topology" may (in some examples), and with reference to nanovoids, refer to their overall arrangement within the NVP material and may include their sizes and/or shapes as well as their respective spatial distributions (e.g., number density, periodicity, polydispersity, etc.) throughout the bulk polymer matrix. By way of example, the sizes of the nanovoids and/or the nanovoid size distribution may vary spatially within the NVP material (e.g., laterally, radially, and/or with respect to the thickness of the nanovoided material).

Polymer materials including voids having nanoscale dimensions may possess a number of advantageous attributes. For example, nanovoided polymers may exhibit a higher transmission of visible light than their larger voided counterparts. Accordingly, disclosed NVP materials may be transparent in various embodiments and may include a transparent bulk polymer material, a transparent interfacial film material, and nanovoids that are filled with a transparent medium, such as a gas, allowing light to readily pass through the NVP materials. According to some examples, the sizes, shapes, and/or distribution of nanovoids dispersed in the bulk polymer material may be selected to produce a predetermined effective refractive index in the NVP material. Additionally, the incorporation of nanovoids into a polymer matrix may increase the permittivity of the resulting composite. Furthermore, the high surface area-to-volume ratio associated with nanovoided polymers provides a greater interfacial area between the nanovoids and the surrounding polymer matrix. With such a high surface area structure, electric charge can accumulate at the void-matrix interface, which can enable greater polarizability and, consequently, increased permittivity ($\varepsilon_r$) of the composite, which effect may be enhanced by the inclusion of the interfacial films. Additionally, because ions or electrons can only be accelerated over small distances within nanovoids, the likelihood of molecular collisions that liberate additional ions and create a breakdown cascade is decreased, which may result in the nanovoided material exhibiting a greater breakdown strength (i.e., dielectric strength) than un-voided or even macro-voided dielectrics.

In accordance with various embodiments, NVP materials described herein may include electroactive polymer components in bulk polymer and/or interfacial film materials. Such electroactive polymer components may include, for example, a deformable, electroactive polymers that may be symmetric with regard to electrical charge (e.g., polydimethylsiloxane [PDMS], polyacrylates, etc.) or asymmetric (e.g., poled polyvinylidene fluoride [PVDF] or its co-polymers such as poly[vinylidenefluoride-co-trifluoroethylene] [PVDF-TrFE]). Example electroactive polymer materials may additionally or alternatively include silicon-containing polymers, such as polysiloxane or silicone polymers. In some examples, the bulk polymer material may include a silicone-based polymer, such as a silicone polymer that is cured using a hydrosilylation catalyst. Example polymers also include acrylic polymers, such as free-radical initiated polyacrylates. Additional polymers for forming bulk polymer materials may include thermoset polymers.

In the presence of an electrostatic field, an NVP material including an electroactive polymer material may deform (e.g., compress, elongate, bend, etc.) according to the magnitude and direction of an applied electrostatic field. Generation of such a field may be accomplished by, for example, placing the NVP material between two electrodes (i.e., a primary electrode and a secondary electrode), each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the NVP material may be in its relaxed state undergoing no induced deformation, or stated equivalently, no induced strain, either internal or external.

The physical origin of the compressive nature of electroactive polymer materials in the presence of an electrostatic field, being the force created between opposite electric charges, is that of the Maxwell stress, which is expressed mathematically with the Maxwell stress tensor. The level of strain or deformation induced by a given electrostatic field correlates to the square of the electrostatic field strength, the dielectric constant of the electroactive polymer material, and the elastic compliance of the electroactive polymer material. Compliance, in this case, is the change of strain with respect to stress (i.e., the change in displacement with respect to force).

According to some embodiments, nanovoids that include interfacial films may be filled with a gas to suppress electrical breakdown of the NVP material (for example, during capacitive actuation). The gas may include one or more gas species, such as, for example, air, nitrogen, oxygen, argon, sulfur hexafluoride, an organofluoride, and/or any other suitable gas. In some embodiments, such a gas may have a high dielectric strength.

In some embodiments, the application of a voltage to an NVP material may change the internal pressure of a gas or gaseous mixture within the nanovoided regions thereof. For example, gases in the nanovoids may diffuse either into or out of the interfacial films and/or bulk polymer material during dimensional changes associated with deformation of the NVP material. Such changes in nanovoid gases can affect, for example, hysteresis of the NVP material during dimensional changes and may also result in drift when the NVP material's dimensions are rapidly changed.

In various embodiments, in a first state of an NVP material that includes an electroactive polymer material, when no electroactive field is generated across the NVP material, the sizes of the nanovoids present inside the NVP material may be less than about 1000 nm and greater than about 5 nm in diameter. The subsequent application of an electrostatic field across the NVP material may result in a mechanical compression of the NVP material and a corresponding change in sizes of the nanovoids. In one embodiment, an electric field generated between electrodes abutting the NVP material may reduce the nanovoid sizes by a factor of 2 or more. For example, in a second state of the NVP material, when an electrostatic field is applied across the NVP material, the sizes of the nanovoids may be reduced down to diameters of between about 0.1 nm and about 50 nm based on the degree of compression corresponding to the magnitude of the electrostatic field.

In some embodiments, the NVP may include an elastomeric polymer material in the bulk polymer material and/or the interfacial films. As used herein, an "elastomer" or an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. The elastomeric polymer material may have an elastic modulus of, for example, less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.5 GPa, including ranges between any of the foregoing values).

Figure 2A:
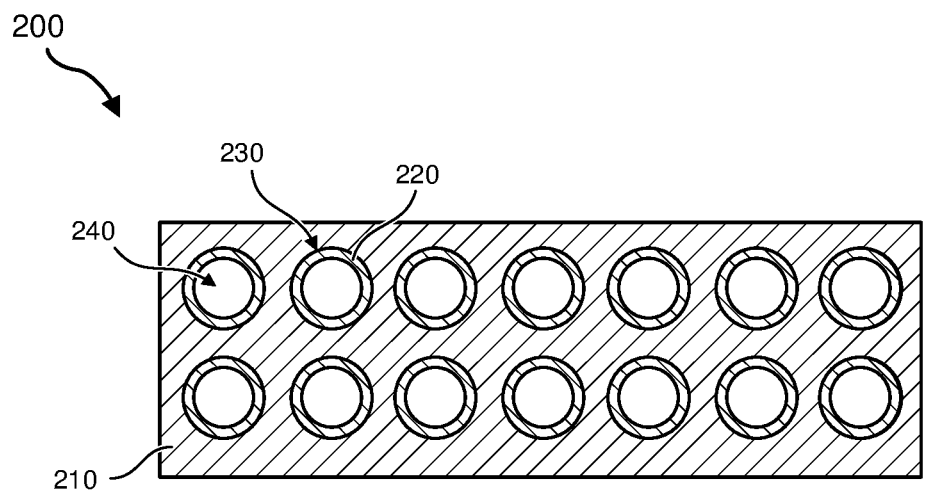
FIG. 2A is an illustration of an example nanovoided polymer material with a periodic array of nanovoids according to some embodiments.

FIG. 2A shows an example NVP material having a periodic array of nanovoids in accordance with some embodiments. As shown in this figure, an NVP material 200 may include a bulk polymer material 210, as described herein, forming a bulk matrix that defines a regular array of nanovoids 230. The nanovoids 230 are each coated with an interfacial film 220 at interfaces between each of the plurality of nanovoids 230 and the bulk polymer material 210. The interfacial film 220 of each nanovoid 230 may surround a fluid volume 240, such as a gas and/or liquid volume, within the nanovoid 230.

Figure 2B:
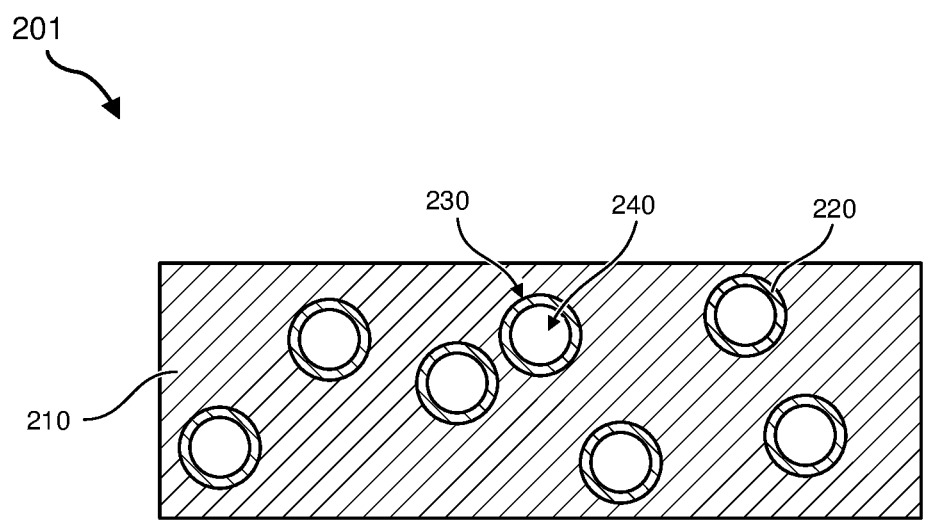
FIG. 2B is an illustration of an example nanovoided polymer material with a non-periodic array of nanovoids according to some embodiments.

FIG. 2B shows an example NVP material having a non-periodic array of nanovoids in accordance with various embodiments. For example, as shown in this figure, an NVP material 201 may include a bulk polymer material 210 that defines a plurality of nanovoids 230 in an arrangement having no long-range periodicity or order. Here the bulk polymer material 210 is filled with an irregular dispersion (e.g., random, pseudo-random, or other non-periodic dispersion) of nanovoids 230, and the nanovoids 230 are each coated with an interfacial film 220 surrounding a fluid volume 240.

Figure 3:
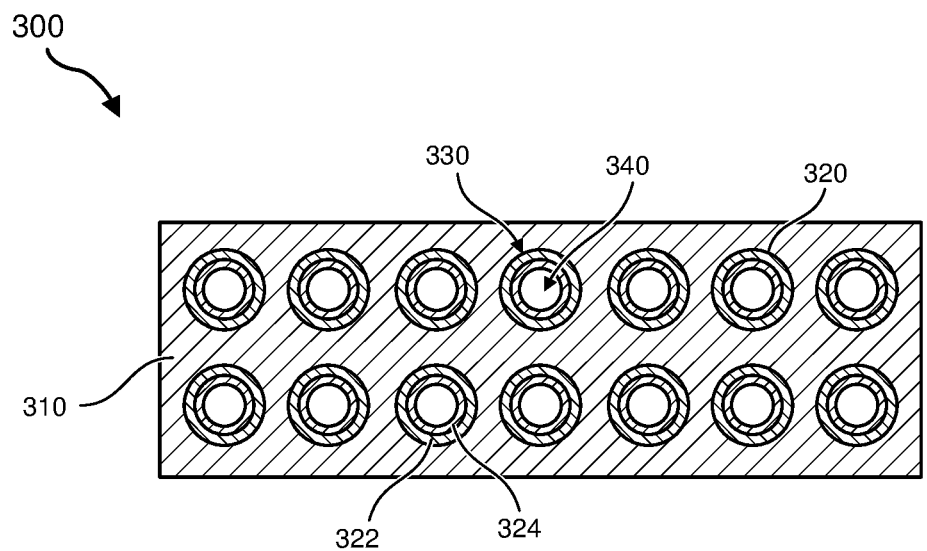
FIG. 3 is an illustration of an example nanovoided polymer material with nanovoids that include multilayer interfacial films according to certain embodiments.

FIG. 3 shows an example NVP material having nanovoids that include multilayer interfacial films in accordance with additional embodiments. As shown in this figure, an NVP material 300 may include a bulk polymer material 310, as described herein, defining an array of nanovoids 330. Here the nanovoids 330 are each coated with an interfacial film 320 that includes two layers of material (which may be the similar or dissimilar), including a first material 322 in a first layer and a second material 324 in a second layer. In this example, the first material 322 is coated on inner surfaces of the bulk polymer material 310 defining the nanovoids 330 and the second material 324 is coated on the first material 322 so as to surround a fluid volume 340 within each nanovoid 330. Although the interfacial films 320 illustrated in FIG. 3 are each shown as including two materials (i.e., first and second materials 322 and 324) formed in two layers, the interfacial films 320 may each include any suitable number of additional layers and/or materials up to a point at which the total number of layers and their thicknesses completely fills the respective voids.

Figure 4:
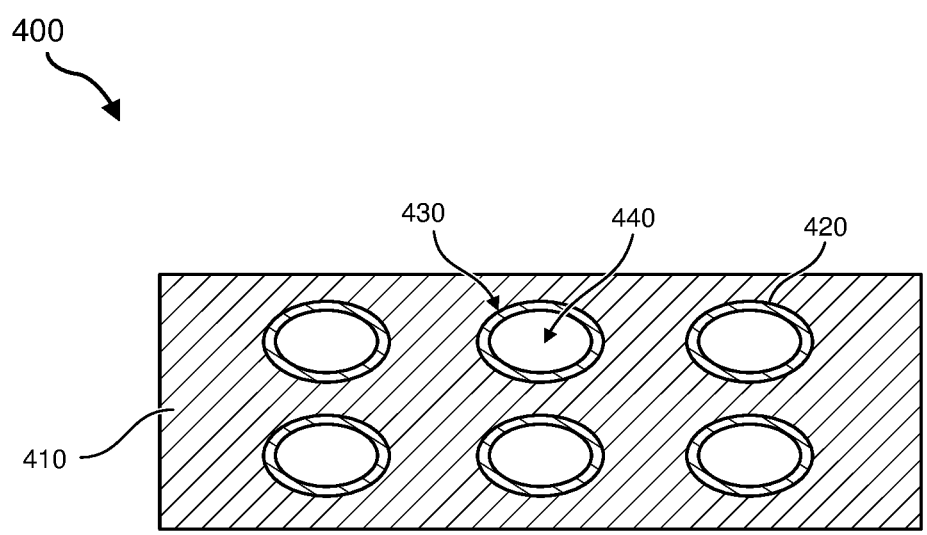
FIG. 4 is an illustration of an example nanovoided polymer material with anisotropic nanovoids according to some embodiments.

FIG. 4 shows an example NVP material having anisotropic nanovoids in accordance with some embodiments. As illustrated in FIG. 4, an NVP material 400 may include a bulk polymer material 410 that defines an array of nanovoids 430 that are anisotropic in shape (e.g., non-spherical, ovoid, ellipsoid, disc-shaped, etc.). As shown in this figure, the bulk polymer material 410 may be filled with a periodic or non-periodic array of ovoid nanovoids 430, with each of the nanovoids 430 being coated, on a corresponding inner surface of bulk polymer material 410, with an interfacial film 420 surrounding an fluid volume 440, which may have a corresponding ovoid shape or other suitable shape.

The disclosed NVP materials, including NVP materials 200, 201, 300, and 400 illustrated in FIGS. 2A-4, may be formed in any suitable manner, as will be described in greater detail below. A bulk polymer material defining nanovoids in an NVP material may be formed prior to forming interfacial films, following formation of interfacial films, and/or concurrently with formation of the interfacial films using any suitable technique and/or combination of techniques, including those described herein. In some examples, a bulk polymer material defining a plurality of nanovoids may first be formed. Interior surfaces of the bulk polymer material defining the nanovoids may then be coated with one or more layers of material forming the interfacial films. In additional examples, a precursor mixture for producing an NVP material may include a component (e.g., a surfactant) of the interfacial films and/or a curable component for forming the interfacial films combined with a bulk-polymer-forming phase. In some examples, particles including a component of the interfacial films, a curable component for forming the interfacial films, and/or a preformed cured film (e.g., preformed nanoballoons having a voided interior) may be dispersed within a mixture for forming the bulk polymer material. In at least one example, nanoballoons that include individual polymer shells (e.g., cured elastomeric shells) having porous interiors (e.g., gas-filled interiors) may be mixed with a curable phase. The curable phase may be cured to form the bulk polymer material surrounding nanovoids with interfacial films including the polymer material of the preformed nanoballoon shells. Additionally or alternatively, in some embodiments, a precursor mixture for producing an NVP material may include a first curable component for forming the bulk polymer material and a second curable component for forming the interfacial films. In such examples, the first and second curable components may be homogenously mixed and may subsequently separate out from each other during curing of either the first or the second component. Alternatively, the first and second curable components may be segregated into separate phases of an emulsion.

The disclosed NVP materials may include any suitable polymeric compounds and/or other compounds in the bulk polymer material (e.g., bulk polymer material 210, 310, and/or 410 in FIGS. 2A-4) and the interfacial films (e.g., interfacial film 220, 320, and/or 420 in FIGS. 2A-4). The bulk polymer material and the interfacial films may include the same compounds or two or more different compounds. In some embodiments, the bulk polymer material and/or interfacial films may include a silicon-containing polymer, such as a polysiloxane or silicone polymer. Example polymers include polyalkylsiloxanes, and blends and derivatives thereof, such as a polydimethylsiloxane (PDMS). In some examples, a polymer may be a silicone-based polymer polymerized using, for example, a hydrosilylation catalyst. Example polymers also include acrylic polymers, such as free-radical initiated polyacrylates. Additional examples of polymers of the bulk polymer material and/or the interfacial films of the NVP materials may include, without limitation, acrylics, epoxies, polyurethanes, styrene-based polymers, polyamine-based polymers, polyesters, polycarbonates, halogenated polymers, silicon-based polymers (e.g., silicones), or combinations thereof.

In some embodiments, the bulk polymer material and/or interfacial films of disclosed NVP materials may be formed via polymerization and/or cross-linking of one or more polymer-forming components, such as monomers, curing agents, and/or other polymer precursors (e.g., oligomers, prepolymers, and/or polymers), including, for example, acrylates (e.g., ethyl acrylate, butyl acrylate, octyl acrylate, ethoxy ethyl acrylate, chloromethyl acrylate, methacrylic acid, dimethacrylate oligomers, other acrylates, or a combination thereof), ethers (e.g., 2-chloroethyl vinyl ether, allyl glycidyl ether, other ethers, or a combination thereof), acrylamides (e.g., N-methylol acrylamide), amides, styrenes, vinyls, epoxides, and mixtures thereof. The term polymerization may include co-polymerization.

Additional examples of polymer-forming components may include curing agents, such as polyamines, isocyanates, fatty acids (e.g., higher fatty acids having aliphatic tails of 13 or more carbon atoms, such as tall oil fatty acids, oleic acid, palmitic acid, linoleic acid) or their esters, sulfur compounds (e.g., elemental sulfur), styrenes, epoxies, or combinations thereof. Such materials, according to some embodiments, may have a selected dielectric constant or relative permittivity, such as, for example, a dielectric constant ranging from approximately 1.2 to approximately 30. In some examples, the bulk polymer material and/or the interfacial film may include a thermoset polymer formed by heating a curable component, such as a thermosetting resin and/or mixtures including monomers and/or pre-polymers, including, for example, a polyurethane, epoxy, polyester, phenolic, vinyl ester, silicone, polyamide, and/or polyamide-imide resin. In various examples, the bulk polymer material and/or the interfacial film may include an acrylic polymer formed from polymerization of acrylic acid that is free-radical initiated. In additional examples, the bulk polymer material and/or the interfacial film may include a silicone-based polymer formed via catalytic hydrosilylation of a curable component, including, for example, alkenes and/or alkynes.

In some examples, a curable component may include monofunctional, bifunctional, and/or polyfunctional acrylates as well as initiators. In some examples, polymers may be cross-linked, e.g., during polymerization or during a separate cross-linking step later. For example, an NVP material (or a precursor thereof) may be polymerized, pre-stretched, or otherwise deformed, followed by cross-linking to hold the pre-stretch or other deformation. In some examples, a phase inversion may be induced by modification of a surface on which the precursor composition is deposited. For example, the surface energy of a substrate may be modified to induce the phase inversion (e.g., by photoisomerization of a surface coating). In some examples, the NVP material may include traces of a salt and/or surfactant used to induce and/or stabilize a phase of the precursor composition used in fabrication. These traces may have little effect on functionality of the NVP material, or may, in some examples, may result in advantageous improvements to the NVP material in certain applications. For example, an NVP material element used as a component of a solid or multiphase electrolyte component (such as an electron conductor in a battery or an ion conductor in a fuel cell, or as a separator in any electrochemical device) may advantageously include ions, such as salt ions. Additional examples include electroactive devices having an electroactive element including an NVP material layer. Such an electroactive element may include other materials (for example, as layers) such as a polymer (e.g., a non-voided polymer), a metal (such as a transition metal, or other metal such as aluminum), an inorganic material, such as an oxide (e.g., a metal oxide or non-metal oxide such as silica), and/or particles (such as microparticles, nanoparticles, or a solution or emulsion of nanoparticles).

Various manufacturing methods may be used to form the disclosed NVP materials, which may include NVP layers or structures having a disordered or ordered arrangement of nanovoids. Methods for forming NVP materials having randomly-distributed (i.e., disordered) voids include selectively depositing a polymer composition or a polymeric precursor composition (e.g., resin) to form voids in situ, or depositing a polymer or polymeric precursor composition containing a dispersed templating agent and then selectively removing the templating agent, while a regular (i.e., ordered) arrangement of voids may be formed by self-assembly and/or various lithography techniques.

Figure 5A:
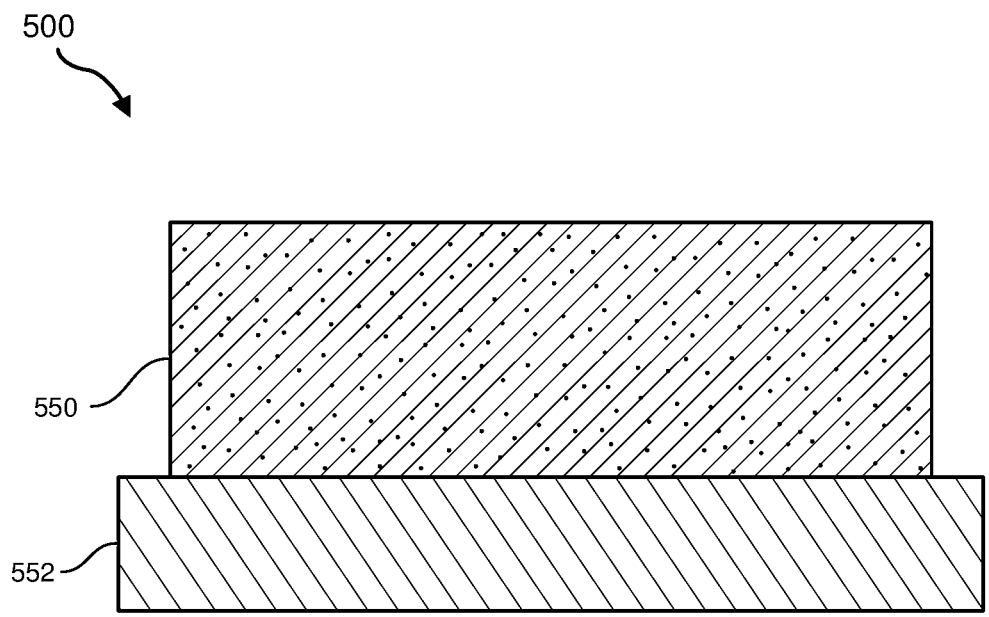
FIG. 5A is an illustration of an example precursor composition for producing a nanovoided polymer material according to some embodiments.

FIGS. 5A-5D illustrate various precursor compositions and materials that may be utilized during fabrication of NVP materials (e.g., NVP materials 200, 300, and 400 in FIGS. 2A-4), as disclosed herein. FIG. 5A shows an example precursor composition for producing an NVP material in accordance with various embodiments. As illustrated in FIG. 5A, a precursor composition 500 may include a mixture 550 that includes one or more polymer-forming components, which may be dispersed in one or more solvents. Mixture 550 may be a heterogeneous or homogeneous mixture, and in various embodiments, mixture 550 may transition from a homogeneous to a heterogeneous state during processing (e.g., during polymerization of a curable component dissolved in mixture 550). Precursor composition 500 may have a selected thickness for producing a cured NVP material of a desired thickness and may be deposited in a single step or in multiple steps involving sequential deposition of multiple layers. In some examples, precursor composition 500 may be disposed on a substrate 552, which may include any suitable support structure for forming the NVP material. In at least one example, substrate 552 may include an electrode, optical element, or other suitable element that is later incorporated into a device that includes the NVP material.

Figure 5B:
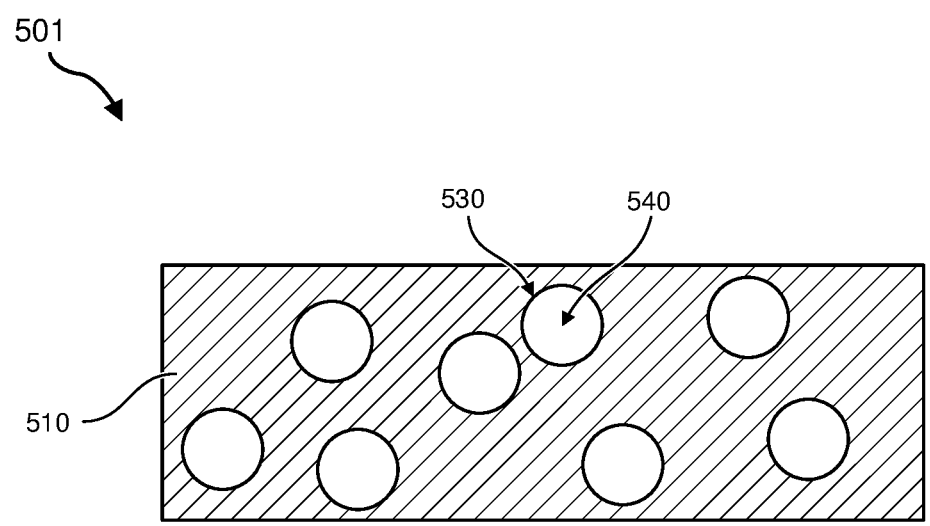
FIG. 5B is an illustration of an example intermediate-stage nanovoided polymer material including a bulk polymer matrix for producing a nanovoided polymer material according to some embodiments.
Figure 6:
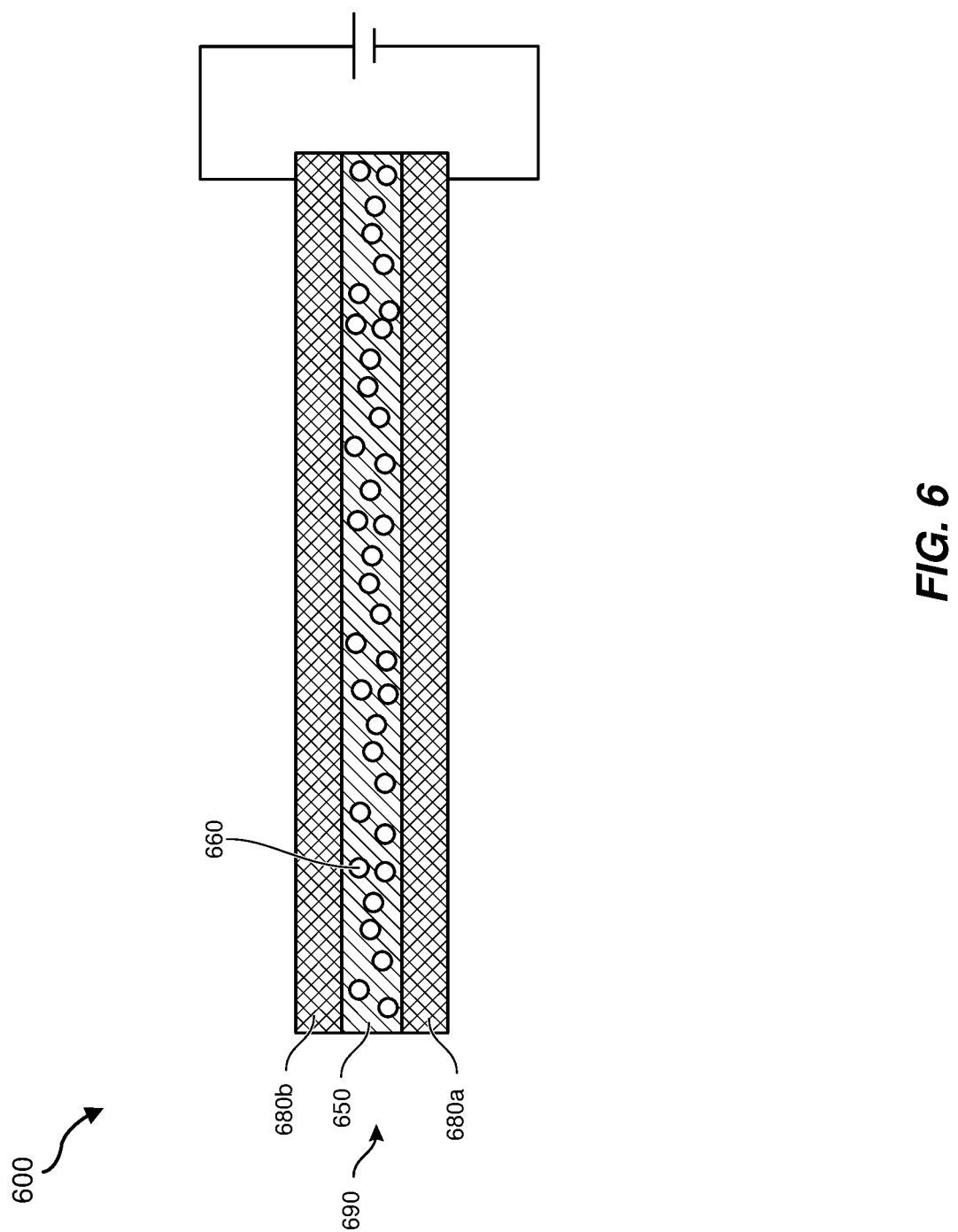
FIG. 6 is an illustration of an example electroactive device that includes a nanovoided polymer material according to some embodiments.

FIG. 5B shows an example intermediate-stage NVP material for producing a nanovoided material having nanovoids coated with interfacial films in accordance with various embodiments. As illustrated in FIG. 5B, an intermediate-stage NVP material 501 may include a bulk polymer material 510 forming a bulk matrix that defines an array of nanovoids 530, with each of nanovoids 530 including a fluid volume 540 that includes a gas and/or liquid. Bulk polymer material 510 of intermediate-stage NVP material 501 may be partially or fully cured. In various examples, nanovoids 530 in bulk polymer material 510 may not yet be coated with an interfacial film at this stage. Accordingly, NVP material 501 may be further processed using any suitable method, including one or more techniques disclosed herein, to form interfacial films on internal surfaces of bulk polymer material 510 defining nanovoids 530 (see, e.g., FIGS. 2A-4).

Figure 5C:
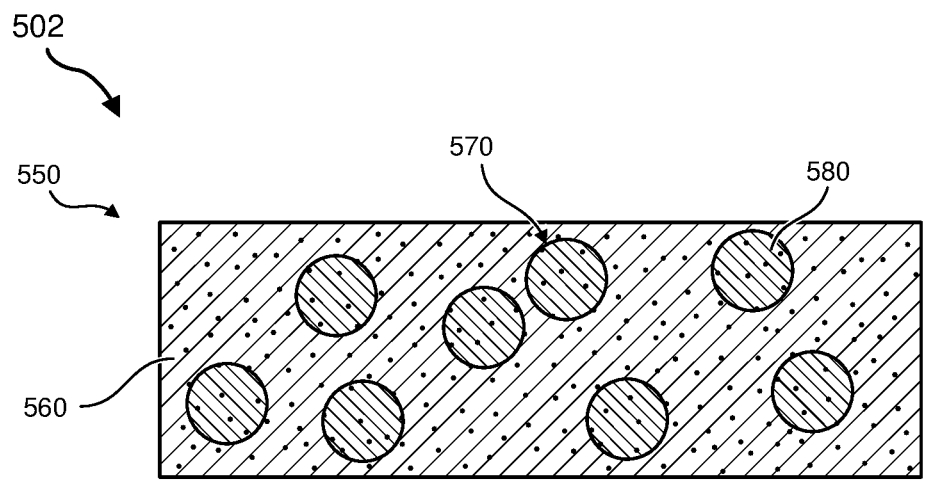
FIG. 5C is an illustration of an example precursor composition for producing a nanovoided polymer material according to some embodiments.

FIG. 5C shows an example precursor composition for producing an NVP material in accordance with various embodiments. As illustrated in FIG. 5C, a precursor composition 502 may include a heterogeneous mixture 550, such as a suspension (e.g., a colloid, such as an emulsion) that includes at least two separate phases, including an external phase 560 (i.e., a continuous phase) and an internal phase 580 (i.e., a discontinuous or dispersed phase). In some embodiments, the internal phase 580 may be included in dispersed-phase regions 570 dispersed throughout at least a portion of the external phase 560. In some examples, the dispersed-phase regions 570 may correspond to regions that include nanovoids in a subsequently formed NVP material (see, e.g., FIGS. 2A-4). The external phase 560 and/or the internal phase 580 may include one or more polymer-forming components and/or other components for producing a bulk polymer material and/or interfacial films of an NVP material, as disclosed herein. The mixture 550 of precursor composition 502 may be formed in any suitable manner, as described herein, and in some examples, the internal phase 580 may become an external phase and, correspondingly, the external phase 560 may become an internal phase during, for example, a phase inversion process.

Figure 5D:
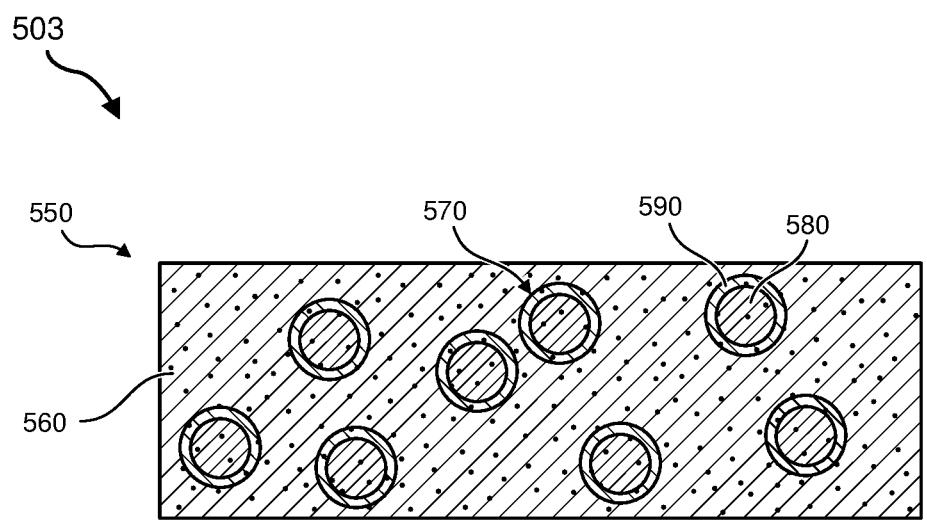
FIG. 5D is an illustration of an example precursor composition for producing a nanovoided polymer material according to some embodiments.

In some embodiments, at least one additional component, such as a surfactant and/or lipid bilayer, may be included in a precursor composition to facilitate formation and/or stabilization of a dispersion and/or to enable selective tuning of one or more characteristics of the dispersion. FIG. 5D shows an example precursor composition for producing an NVP material in accordance with various embodiments. As illustrated in FIG. 5D, a precursor composition 503 may include a heterogeneous mixture 550, such as a suspension (e.g., a colloid, such as an emulsion, or a dispersion of liposomes), that includes at least two separate phases, including an external phase 560 and an internal phase 580. The mixture 550 of precursor composition 502 may additionally include a dispersing agent 590 (e.g., an emulsifying and/or stabilizing agent, such as a surfactant, a lipid bilayer, etc.), as disclosed herein, surrounding the internal phase 580 in dispersed-phase regions 570. In some examples, the dispersing agent 590 may form at least part of the interfacial films in a subsequently formed NVP material.

In some embodiments, an NVP material, as disclosed herein, may be formed via local a deposition of a precursor composition (see, e.g., precursor composition 550 in FIGS. 5A, 5B, and 5C) that includes one or more curable components (e.g., monomers, oligomers, prepolymers, polymers, etc.) for NVP material fabrication. The curable components may include one or more monomers, such as monofunctional monomers (e.g., to cap polymerization), bifunctional monomers, and/or other polyfunctional monomers. The precursor composition may include curable components dissolved in solvents, such as aliphatic, aromatic, or halogenated hydrocarbons, or combinations thereof. In some examples, the precursor composition may form an emulsion or nanoemulsion of, for example, monomer droplets dispersed in a liquid matrix. In at least one example, the precursor composition may also include a non-solvent (e.g., a liquid immiscible with the monomer components) to create an emulsion of, for example, droplets of monomer in a matrix of an immiscible liquid. The non-solvent may be organic or inorganic, such as water or a hydrocarbon, or a highly polar organic compound, such as ethylene glycol. Formation and/or stabilization of emulsions may, for example, be facilitated through inclusion of a surfactant (e.g., an ionic or nonionic surfactant), lipid, and/or protein in the precursor composition. In various examples, a phase inversion may be used to create a liquid matrix including one or more monomers surrounding droplets of non-polymerizable liquid and/or droplets including one or more other monomer species. Phase inversion may be induced, for example, by changing ambient conditions (such as pressure and/or temperature), modifying component concentration (e.g., by allowing a relatively volatile component to selectively evaporate, and/or or adding more of one or more components to the precursor composition, for example, by increasing a volume fraction of a monomer), or adding additional components to the precursor composition (e.g., another liquid component, sugar, salt, or salt solution). Additionally or alternatively, emulsions or nanoemulsions may be formed through various other techniques, including, for example, high-pressure homogenization, ultrasonication, cavitation, vapor condensation, and/or via formation of lipid bilayers.

In some embodiments, NVP materials may be formed via a phase separation between a solvent (i.e., a solvent or solvent mixture) and one or more curable components, such as polymer precursors (e.g., monomers, oligomers, prepolymers) and/or polymers that are polymerizable and/or cross-linkable, during curing of the curable components. For example, an NVP material may be formed via a phase separation between a curable component and a solvent of a precursor composition by (i) curing the curable component to form a bulk polymer material defining a plurality of solvent regions including the solvent, (ii) removing at least a portion of the solvent from the plurality of solvent regions via a change in at least one of pressure or temperature to form a plurality of nanovoids defined in the bulk polymer material (see, e.g., FIG. 5B), and (iii) forming interfacial films on inner surfaces of the bulk polymer material defining the plurality of nanovoids (see, e.g., FIGS. 2A-4). In some examples, the interfacial films may be formed via atomic layer deposition of atomic layer precursors diffused in the NVP material. In various embodiments, a plurality of nanovoids may be formed in a bulk polymer material via any other suitable technique, including those disclosed herein, followed by formation of interfacial films in the nanovoids.

In some examples, NVP material formation may include depositing the precursor composition on a suitable substrate prior to curing one or more components of the precursor composition. The precursor composition may be deposited in any suitable manner, including, for example, by printing, spin coating, CVD, vapor coating, thermal spraying, dip coating, spray coating, and/or lamination. In at least one example, the NVP material may be formed in a single layer or a plurality of layers via extrusion. In some embodiments, the precursor composition may be mixed and/or emulsified prior to deposition. Additionally or alternatively, mixing and/or emulsification of at least some of the components may occur during and/or following deposition. The precursor composition may be deposited in a single layer or multiple layers having the same or different components.

In at least one embodiment, depositing a precursor composition for forming an NVP material may include printing the precursor composition onto a substrate (see, e.g., FIG. 5A). Printing may include at least one of inkjet printing or silkscreen printing, for example. In some examples, processing the mixture may include curing the curable component to form the cured bulk polymer material. A curing source and/or heat source, for example, may be used to process the mixture and may include an energized array of filaments that may generate actinic energy to heat the curable component. In some embodiments, removing at least the portion of the at least one non-curable component from the cured polymer material may lead to the formation of a plurality of voids defined in the nanovoided polymer material.

In some embodiments, the at least one non-curable component may include a solvent (i.e., a single solvent species or mixture of multiple solvent species). Processing the mixture may include curing the curable component to form the cured bulk polymer material, which may include the solvent in the plurality of defined regions. Moreover, removing at least a portion of the at least one non-polymeric component from the cured bulk polymer material may include removing at least a portion of the solvent to form the nanovoids defined in the bulk polymer material.

In some examples, the at least one non-curable component may include a cavitation agent. Further, processing the mixture may include exposing the mixture to light sufficient to cure the curable component and decompose the cavitation agent to form the cured bulk polymer material, which may include at least one decomposition product of the cavitation agent in the plurality of defined regions. Further, removing at least the portion of the at least one non-polymeric component from the cured bulk polymer material may include removing at least a portion of the at least one decomposition product from the cured bulk polymer material. Example cavitation agents include beta-keto acetic acids, such as acetone dicarboxylic acid.

In various embodiments, depositing a mixture for forming an NVP material may include using a suitable CVD process to vaporize a curable component and deposit the vaporized curable component onto a substrate. The method may further include (i) combining the curable component with at least one non-curable component to form a mixture including the curable component and the at least one non-curable component on the substrate (see, e.g., FIG. 5A), (ii) curing the curable component to form a bulk polymer material defining a plurality of solvent regions including the non-curable component, (iii) removing at least a portion of the at least one non-curable component from the cured bulk polymer material to form a plurality of nanovoids defined in the bulk polymer material (see, e.g., FIG. 5B), and (iv) forming interfacial films on inner surfaces of the bulk polymer material defining the plurality of regions (see, e.g., FIGS. 2A-4).

The curable component may be mixed with the non-curable component either prior to, during, and/or following vaporization and deposition. For example, the curable and non-curable component may be mixed and vaporized using a single vaporization apparatus when, for example, the curable and non-curable components have similar vapor pressures. In additional examples, the curable component and the non-curable component may be vaporized separately and combined upon deposition. In some embodiments, removing at least the portion of the at least one non-curable component from the cured polymer material may form a plurality of nanovoids defined in the NVP material (e.g., at the locations of the defined solvent region). In at least one example, vaporizing the curable component may include vaporizing the curable component in a vaporizer and depositing the vaporized curable component onto the substrate may include depositing the vaporized curable material while continuously changing the position of the substrate with respect to the vaporizer.

Following deposition of a precursor composition, a non-curable component, such as a solvent, may then be evaporated from nanovoids of the NVP material. In some examples, partial solvent evaporation may be allowed before full curing of a curable phase forming the bulk polymer material or interfacial films. This may induce partial nanovoid collapse and formation of anisotropic nanovoids, such as, for example, ovoid and/or disk-shaped nanovoids. The precursor composition may, for example, be partially cured before partial (or complete) solvent removal from the nanovoided polymer material, for example, to achieve partial (or otherwise limited) nanovoid collapse. Following partial curing and at least partial removal of the solvent from the nanovoids, the precursor composition may be further cured and remaining solvent may then be removed, leaving anisotropic nanovoids in the resulting NVP material. In some embodiments, such initial partial curing and subsequent curing may be accomplished via, for example, a two-stage polymerization process to form a network of first and second stage polymers.

In some embodiments, an NVP material having a periodic array of nanovoids (see, e.g., FIGS. 2A, 3, and 4) or any other desired arrangement of nanovoids may be selectively formed in a controlled manner by 3-dimensional printing of a curable polymer-forming mixture onto a substrate surface. According to further embodiments, an NVP material having a periodic array of nanovoids may be formed using photolithography, which may include exposure and developing steps using a focused energy beam or blanket exposure in conjunction with a photomask. Example lithography techniques include optical (e.g., photolithography, UV lithography, etc.), electron beam, and/or imprint lithography, and/or other patterning techniques capable of resolving features on the order of approximately 3 to approximately 1000 nm. Other suitable lithography techniques may include direct-write, interferometric, and/or layered-imprint lithography techniques. In additional embodiments, nanovoids may be formed in an NVP material using various other techniques, including nanoimprint lithography utilizing focused ion beam milling, laser lithography utilizing multi-beam laser interference (e.g., nanoscribing), direct laser emitting, and/or any other suitable technique enabling formation of a nanovoided material having a periodic array of nanovoids. In these embodiments, interfacial films may be formed, for example, following formation of the nanovoids. According to at least one example, the interfacial films may be formed in the nanovoids at interfaces of the bulk polymer material via, for example, a suitable CVD process (e.g., thin-film deposition, such as atomic layer deposition), as disclosed herein.

According to at least one embodiment, NVP materials may be formed via a phase separation between two or more different curable components, as disclosed herein, in a precursor composition. For example, an NVP material may be formed via a phase separation between a first curable component and a second curable component/solvent of a mixture (see, e.g., mixture 550 in FIG. 5A) by (i) curing the first curable component to form a bulk polymer material, which includes a first cured polymer, defining a plurality of regions (see, e.g., regions 570 illustrated in FIG. 5C) including the second curable component and the solvent, the plurality of regions corresponding to a plurality of nanovoids, (ii) curing the second curable component to form interfacial films, which include a second cured polymer, on inner surfaces of the bulk polymer material defining the plurality of regions, and (iii) removing at least a portion of the solvent from the plurality of regions via a change in at least one of pressure or temperature to form the plurality of nanovoids, which include the interfacial films, defined in the bulk polymer material (see, e.g., FIGS. 2A-4). In additional embodiments, an NVP material may be formed via a phase separation between a first curable component and a second curable component/solvent of a mixture by (i) curing the second curable component to form interfacial films, which include a second cured polymer, surrounding the solvent in regions corresponding to a plurality of nanovoids, (ii) curing the first curable component to form a bulk polymer material surrounding the interfacial films, and (iii) removing at least a portion the solvent via a change in at least one of pressure or temperature to form the plurality of nanovoids, which include the interfacial films, defined in the bulk polymer material (see, e.g., FIGS. 2A-4).

In these embodiments, one of the first curable component or the second curable component may be selectively cured by exposing the mixture, which includes both the first curable component and the second curable component, to a first radiation or heat source such that the other of the first curable component and the second curable component remains at least partially unreacted prior to exposure to a second radiation or heat source. For example, an NVP material may be produced from a mixture of at least one solvent and at least two separate curable components, such as distinct monomer species that are each individually curable under different conditions. For example a first monomer of the mixture may be cured by a first source of radiation (e.g., UV light), while a second monomer of the mixture may be cured by a second source of radiation (e.g., heat, electron-beam radiation, x-ray radiation) or heat. When the first monomer is cured to form a polymer of the bulk polymer material or the interfacial films, as described above, the cured polymer may exclude the second monomer along with the solvent, thereby forming nanovoids, which may include the solvent and/or the second monomer internally.

In an example, the first monomer may include a free-radical-initiated monomer (e.g., an acrylic polymer forming monomer, such as methacrylic acid, an acrylate, etc.) that may be activated (e.g., polymerized) by a first type of radiation, such as UV light, while the second monomer may include a different monomer type, such as an epoxy, that is unaffected or substantially unaffected by the first type of radiation. Moreover, the second monomer may be cured by a second type of environmental exposure, such as heat. Accordingly, when the first monomer, the second monomer, and the solvent are mixed, the first monomer and second monomer may both dissolve in the solvent. The mixture may then be irradiated with a first type of radiation (e.g., UV light) such that the first monomer begins to polymerize and form a first polymer in, for example, the bulk polymer material. During the polymerization process, the solvent and the second monomer may be excluded and forced into regions surrounded by the polymerizing first monomer, leading to the formation of partially-formed nanovoid regions defined in the bulk polymer material. Subsequently, heat may be applied to the partially-formed nanovoid regions such that the solvent evaporates, leaving the second monomer coating interior surfaces of the bulk polymer material defining the partially formed nanovoids and leading to the formation of the nanovoids in the NVP material. The second monomer (e.g., an epoxy) may then be polymerized to form interfacial films that include a second polymer disposed on the interior surfaces of the bulk polymer material defining the nanovoids in the NVP material.

In some embodiments, NVP materials may be formed from an emulsion that includes separate phases including various components for forming a bulk polymer material and/or interfacial films. For example, an NVP material may be formed via a precursor composition that includes an emulsion (see, e.g., precursor compositions 502 and 503 in FIGS. 5C and 5D) by (i) curing a polymer-forming phase (i.e., an external or continuous phase) of an emulsion to form a bulk polymer material surrounding a plurality of dispersed-phase regions (see, e.g., dispersed-phase regions 570 in FIGS. 5C and 5D), (iii) removing at least a portion of the dispersed phase from the plurality of dispersed-phase regions to form the plurality of nanovoids, and (iv) forming an interfacial film of a plurality of interfacial films at an interface between each of the plurality of nanovoids and the bulk polymer material, the interfacial film including one or more layers of material (see, e.g., FIGS. 2A-4). In at least one example, the polymer-forming phase (i.e., external phase) may include a solvent and at least one curable component and the dispersed-phase regions may include a non-solvent that is insoluble or substantially insoluble in the solvent. In some examples, the use of an emulsion may be utilized in combination with one or more other techniques disclosed herein and/or any other suitable techniques to form an NVP material. For example, a first curable component and a second curable component may be dispersed with a solvent in, for example, the polymer-forming phase of an emulsion. Phase inversion may then be utilized, as described above, to form a bulk polymer material surrounding interfacial films formed around the dispersed-phase regions and/or formed around separate solvent regions.

In some embodiments, interfacial films may be formed using a precursor composition including an emulsion or nanoemulsion. For example, an emulsion for forming the NVP material may include various precursors, solvents, non-solvents, and/or other components as described herein. In at least one example, an emulsion may include an external phase (e.g., a polymer-forming phase) surrounding a dispersed phase (e.g., a solvent) that is distributed in a plurality of dispersed-phase regions throughout the emulsion. The emulsion or nanoemulsion may be formed, for example, via phase inversion or cavitation using a cavitation agent that is decomposed during curing of a curable component, as described above. Additionally or alternatively, emulsions or nanoemulsions may be formed through various other techniques, including, for example, high-pressure homogenization, ultrasonication, vapor condensation, and/or formation of lipid bilayers. In various examples, formation of such emulsions or nanoemulsions may be facilitated by the inclusion of a surfactant, lipid, and/or protein.

In various embodiments, the NVP materials may include a surfactant. For example, a surfactant may be included in the precursor composition (see, e.g., FIG. 5D) to, for example, facilitate formation of and/or to stabilize an initial emulsion phase, or a phase obtained by phase inversion or both. In some embodiments, the surfactant may provide improved compatibility between various NVP precursor components and/or may facilitate formation and/or stabilization of an emulsion or nanoemulsion for producing an NVP material. For example, a surfactant may improve compatibility between monomers, between a polymer and monomer, and/or between a polymer and a solvent. In various examples, a surfactant may be utilized to control the sizes and/or polydispersity of dispersed phase droplets, thereby controlling the sizes and/or polydispersity of nanovoids in the cured NVP material. For example, the surfactant concentration may be selectively controlled to produce and/or stabilize droplets of a dispersed phase (e.g., a solution including components for forming nanovoids and/or interfacial layers) having a selected average particle size.

In some embodiments, a surfactant may be included in interfacial films coating inner surfaces of a polymerized bulk polymer material defining nanovoids of a cured NVP material. In these examples, the interfacial films may be at least partially formed of the surfactant, which may reduce the surface energy of the nanovoids in the NVP material, thereby reducing adhesive forces and stiction between surfaces of the nanovoids when the nanovoids are compressed. The surfactant may be ionic (i.e., anionic, cationic, or zwitterionic) or nonionic, and may include any suitable surfactant, such as sorbitane monooleate. Additional examples of surfactants may include fatty acids, polymeric emulsifiers, poyethoxylates, fatty alcohol ether sulfates, alkyl sulfates, alkyl phenol ether sulfates, sodium lauryl sulfate, and/or alpha sulfonate.

In various embodiments, a lipid component may be included in the precursor composition to facilitate formation of and/or to stabilize an emulsion or nanoemulsion and/or to provide a stable dispersion of droplets (e.g., an interfacial-film-forming phase) contained within liposomes. In some examples, liposomes, which include lipid bilayers formed of phospholipids (e.g., phosphatidylcholines, such as lecithin, phosphatidylethanolamine, etc.), may be produced prior to introduction into a precursor composition. Certain components of the precursor composition, such as an interfacial-film-forming phase (e.g., one or more curable components, surfactants, solvents, nanoparticles, etc.), may be introduced into the interior of liposomes during and/or following formation of the liposomes. The liposomes may then be dispersed in an external phase, such as a bulk-polymer-forming phase, to produce the precursor composition. In some examples, the liposomes may allow for inclusion of a greater concentration of components utilized in the formation of nanovoids and/or interfacial films of an NVP material due to higher solubility of the liposomes in the external phase. Additionally or alternatively, liposomes may stabilize the precursor composition dispersion by preventing coagulation of the dispersed phase droplets contained within the liposomes. In at least one example, liposomes may enable selective formation of nanovoids and/or interfacial layers having specified sizes and shapes. For example, liposomes may be formed to particular nanoscale diameters prior to incorporation in the precursor composition. In various examples, liposomes may be utilized to control the polydispersity of dispersed phase droplets, thereby controlling the polydispersity of nanovoids in the cured NVP material. The liposome bilayers may also exhibit resistance to stretching and/or bending, enabling formation of nanovoids having a desired shape (e.g., spherical) under a variety of processing conditions.

In various examples, phospholipids (e.g., head groups of the phospholipids) may be chemically modified (e.g., through the addition of polymers, such as polyethylene glycol [PEG]) to alter the external and/or internal surface chemistry of liposomes, facilitating, for example, greater solubility within a solution, such as an external phase solution, and/or to increase the mechanical stability of the liposomes. Liposomes may be produced using a variety of techniques, including, for example, detergent depletion, ethanol injection, reverse-phase evaporation, emulsification, high-pressure homogenization, extrusion, and/or ultrasound (e.g., focused ultrasonication). In some examples, the liposome lipid bilayers and/or layers of lipids from the bilayers (e.g., which have been disrupted during NVP material curing or through another membrane disrupting technique, such as ultrasonication) may be incorporated into the interfacial films of the fabricated NVP materials. For example, the lipid bilayers and/or phospholipids of the bilayers may form the interfacial films or a layer of the interfacial films (e.g., the phospholipids may be coated on surfaces of the bulk polymer material defining the nanovoids, with one or more layers, such as polymer layers and/or a surfactant layers, formed on and surrounded by the phospholipids).

In at least one embodiment, a precursor mixture may include an emulsion of polymer-forming components that may be partially cured, and the partially cured emulsion may be stretched (e.g., stretched optionally while the emulsion is on a substrate) in one or two directions (e.g., orthogonal directions). Further, the stretching may be about 1.5×, (alternatively about 2×, alternatively about 3×, alternatively about 5× the original dimensions of the emulsion). Afterwards, the emulsion may be further cured, and the solvent may be removed thereafter.

In some embodiments, the interfacial films may be formed of and/or may include at least one of a metal, an oxide, or a nitride material. For example, the interfacial films may include one or more layers of a metal, oxide, and/or nitride. The layers may be deposited using any suitable technique. In some examples, atomic layer deposition may be utilized to diffuse gaseous chemical precursors through a bulk polymer material and into nanovoid volumes of an NVP material. For example, a pair of reactant precursors for forming alternating monolayers of the interfacial films may be alternately pulsed under vacuum (e.g., a pressure of less than 1 Torr). The precursors may adsorb on and react with inner surface portions of the bulk polymer material defining the nanovoids and/or layers coating the bulk polymer surface portions (e.g., other interfacial film layers disclosed herein, including but not limited to other monolayers deposited via atomic layer deposition). In some examples, monolayers may be sequentially formed until a desired film thickness is obtained. In some examples, the deposited layers may be incorporated to modify various attributes of the NVP material, such as electrical properties (e.g., to increase the relative permittivity) and/or optical properties (e.g., to increase reflectivity and/or to increase or decrease the refractive index), and/or to provide a reactive species within the NVP material (e.g., to bind or otherwise react with selected gas species). Examples of deposited interfacial film materials may include oxides (e.g., titanium oxide [$TiO_2$], cerium oxide [$CeO_2$], aluminum oxide [$Al_2O_3$], tantalum oxide [$Ta_2O_3$], silicon dioxide [$SiO_2$], zirconium oxide [$ZrO_2$], tin oxide [$SnO_2$], zinc oxide [$ZnO$], yttrium oxide [$Y_2O_3$], indium tin oxide [ITO], and/or other suitable metal or non-metal oxides), nitrides (e.g., titanium nitride [TiN], aluminium nitride [AlN], gallium nitride [GaN], titanium aluminum nitride [TiAlN], silicon nitride [$SiN_x$], tantalum nitride [$TaN_x$], and/or other suitable metal nitrides), metals (e.g., platinum, iridium, palladium, ruthenium, copper, nickel, and/or other suitable metals), and/or other inorganic compounds. The selective formation of such layers may enable the incorporation of components into the NVP material that might otherwise be infeasible to include in a sufficient amount in the bulk polymer material (e.g., due solubility limits of the components in a bulk-polymer-forming phase, etc.).

In additional examples, the interfacial films and/or bulk polymer material may include a nanocomposite material that includes nanoparticles embedded in a polymer matrix. The size of such nanoparticles may be less than 50 nm (e.g., less than 50 nm, less than 20 nm, less than 10 nm, and/or less than 5 nm). In some examples, nanoparticles may be incorporated to modify various attributes of the NVP material, such as electrical properties (e.g., to increase the relative permittivity) and/or optical properties (e.g., to increase reflectivity and/or to increase or decrease the refractive index). Examples of nanoparticle materials may include titanates (e.g., $BaTiO_3$, $BaSrTiO_3$, PZT, PLZT, calcium copper titanate [CCTO], and/or other suitable titanates), oxides (e.g., $TiO_2$, $CeO_2$, $Al_2O_3$, $Ta_2O_3$, $SiO_2$, $ZrO_2$, $SnO_2$, ZnO, $Y_2O_3$, ITO, and/or other suitable metal or non-metal oxides), compounds such as $PbMgNbO_3+PbTiO_3$, and/or other inorganic (e.g., metallic) or organic (e.g., polymeric) compounds. In various embodiments, various components may be incorporated into the NVP material as nanoparticles dispersed within the bulk polymer material and/or interfacial films. The nanoparticles may be combined with a precursor composition that includes, for example, an emulsion that facilitates incorporation of nanoparticles into the NVP material. According to at least one example, nanoparticles that have low solubility in a precursor solution for a bulk polymer material may have increased solubility in an emulsion phase (e.g., a dispersed phase) that includes an interfacial film material or precursor, allowing for increased incorporation of the nanoparticles into the NVP material.

According to some embodiments, the interfacial layers may include an organofluorine compound, such as a fluorocarbon. Examples of fluorocarbons include perfluoroalkanes, fluoroalkenes, fluoroalkynes, and/or perfluoroaromatic compounds. Fluorocarbons of interfacial films may reduce the surface energy of nanovoids in the NVP material, thereby reducing adhesive forces and stiction between surfaces of the nanovoids when the nanovoids are compressed. In various examples, the fluorocarbon may be included in droplets of a dispersed phase of an emulsion in a precursor composition. Due to the low miscibility of fluorocarbons in many solvents, the precursor composition may include a solvent, such as a hydrocarbon solvent (e.g., hexane), that is capable of solvating the fluorocarbon. Following curing and removal of solvents from a subsequently produced NVP material, the fluorocarbon may coat interior surfaces of the bulk polymer material defining the nanovoids and/or other layers (e.g., polymeric layers and/or surfactant layers) of interfacial films formed in the nanovoids.

In some embodiments, the interfacial layers may include a fluorescent compound, such as a fluorophore or derivative thereof. Examples of fluorophores and fluorophore derivatives include fluoresceins, carboxyfluoresceins, rhodamine, and/or fluorescein isothiocyanate. Additional examples of fluorophores include derivatives of cyanine, coumarin, tetrapyrrole, arylmethine, xanthene, squaraine, naphthalene, oxadiazole, anthracene, pyrene, acridine, and oxazine. In at least one embodiment, fluorophores may be incorporated into interfacial films of NVP materials utilized as chemical sensors. For example, a fluorophore may be selected based on chemical compatibility with a gas species of interest. In these examples, the gas species of interest may selectively bind to the fluorophore, while other gas species may not. Post-exposure sensing of the chemical species of interest may be done by, for example, exposing the NVP material to ultraviolet light or another suitable wavelength of light, in which case the gas species of interest bound to the fluorophore will re-radiate light, whereas other gas species will not. This may be accomplished by, for example, introducing a fluorophore, which also selectively binds to the gas species of interest, either as part of the interfacial films before exposure to the gas species of interest or as a separate step after exposure to the gas species of interest. In some examples, the fluorophore may be included in droplets of a dispersed phase of an emulsion in a precursor composition. Following curing and removal of solvents from a subsequently produced NVP material, the fluorophore may coat interior surfaces of the bulk polymer material defining the nanovoids and/or other layers (e.g., polymeric layers and/or surfactant layers) of interfacial films formed in the nanovoids. Additionally or alternatively, a fluorophore compound may be introduced into nanovoids of an NVP material following formation of the nanovoids in a cured bulk polymer material (e.g., via a CVD process in which the fluorophore compound is evaporated and deposited in the nanovoids).

Interfacial films may be selectively formed and may include any suitable compounds for tuning and/or otherwise modifying various properties of the NVP material, as disclosed herein. In some embodiments, interfacial films may include components that having mechanical properties (e.g., Young's modulus, creep rate, toughness, tan delta [δ], Poisson's ratio, etc.), optical properties (e.g., refractive index, reflectance, transparency, scattering, absorption, degree of birefringence, etc.), thermal properties (e.g., thermal conductivity), electrical properties (e.g., resistivity, dielectric breakdown strength, and/or dielectric constant, etc.), chemical properties (e.g., etch rate, diffusion constant, solubility, etc.), and/or other macroscopic material properties that differ from those of a bulk polymer material of an NVP material. Accordingly, the interfacial films can be used to tune one or more mechanical, optical, thermal, electrical, diffusive, chemical, and/or other selected properties of the overall NVP material. In various embodiments, the bulk polymer material and/or the interfacial films of the disclosed NVP materials may be sufficiently thin and/or porous that they are permeable to variety of gas species under selected conditions, such as elevated temperature and/or reduced pressure. The NVP materials may, in some examples, include a network of open-celled nanovoids that allow for passage of gases and/or liquids. Additionally, the interfacial films may include components that enhance gas permeability of the NVP materials. Accordingly, the NVP materials may allow for evaporation and removal of solvents and/or other compounds from interior regions, such as nanovoids, of the NVP materials. Additionally, various vaporized compounds may be diffused into the NVP materials and deposited in the nanovoids to, for example, form or add layers to interfacial films in the nanovoids. Further, by allowing for diffusion of gas species through the bulk polymer materials and/or interfacial films, the NVP materials may be utilized in analytical procedures (e.g., detection of particular chemical species), chemical reactions (e.g., selective catalysis and/or reaction, interfacial film formation, etc.), and/or filtration (e.g., via capture of certain compounds from a gaseous mixture). In at least one example, compounds in the interfacial films may be reactive with various gaseous compounds such that the gaseous compounds selectively bind to and/or react with the interfacial films. In various examples, such reactions may occur spontaneously or may be initiated in the presence of elevated heat and/or radiation from a suitable actinic energy source (e.g., UV light, visible light, x-ray radiation, gamma radiation, and/or electron beam radiation).

In at least one embodiment, disclosed interfacial films may be used to selectively control sizes of nanovoids in an NVP material. For example, a selected concentration of interfacial-film components and/or precursors (e.g., curable components) may be added to a precursor composition used to fabricate the NVP material and the nanovoid sizes may be controlled through any suitable technique, as disclosed herein, such that interfacial films having thicknesses within a specified range are formed within the nanovoids. Additionally or alternatively, interfacial films may be formed, and/or additional layers may be added to formed interfacial films, via deposition (e.g., via CVD, such as atomic layer deposition). The ultimate thicknesses of the interfacial films may control the effective void volumes of the nanovoids (i.e., the volumes surrounded by the interfacial films, which may include a fluid, such as air and/or another gas species). In some examples, the thicknesses of the interfacial films may be further tuned by, for examples, adding additional layers of material until desired interfacial film thicknesses, and likewise effective void volumes, are obtained in the nanovoids.

The disclosed NVP materials may be incorporated into a variety of different devices, as described herein. In some embodiments, disclosed NVP materials may be utilized in electroactive devices that deform in the presence of an electrostatic field. An example device, as shown schematically in FIG. 6, is an electroactive device 600 (e.g., a transducer, an actuator, and/or a sensor), where an electroactive element 690 includes an NVP material, as disclosed herein (see, e.g., NVP materials 200, 201, 300, and 400 in FIGS. 2A-4), formed as a thin film having a bulk polymer material 650 and a plurality of nanovoids 660 dispersed throughout the bulk polymer material 650.

The electroactive element 690 is disposed between a primary electrode 680a and a secondary electrode 680b. The application of a voltage between the primary and secondary electrodes 680a and 680b can cause deformation of the electroactive element 690, such as compression in the direction of the applied electric field and an associated expansion or contraction of the electroactive element 690 in one or more transverse dimensions.

In some embodiments, electroactive device 600 can convert deformations into electrical signals, such as proportional electrical signals that scale with a deformation parameter (such as applied pressure). Electroactive device 600 may also receive an electrical signal that induces a deformation based on the electrical signal (for example, based on the voltage squared or mean square voltage). In at least one example, electroactive device 600 may be a transducer, which may function as an actuator providing a degree of deformation based on the electrical signal and/or as a sensor providing an electrical signal based on a degree of deformation. The electroactive response may be mediated by the dielectric constant and elastic modulus of the electroactive element 690. Using an electroactive element 690 that includes a single homogeneous NVP material film may constrain the transducer response to a particular input electrical signal/output mechanical response across electroactive device 600. In some embodiments, electroactive device 600 may actuate and/or sense deformations as a function of position within a single device, without the need for complex electrode structures, facilitating electroactive devices (such as transducers, actuators, and/or sensors) capable of spatially variable actuation and sensing responses, using a simple electrical architecture such as a pair of electrodes. In some embodiments, electroactive device 600 may be a transducer that converts variations in a physical quantity into an electrical signal, and/or vice versa. In some embodiments, the electrical response of electroactive device 600 may be correlated with a location of a mechanical input. The process by which variations in a physical quantity transforms into an electrical signal, and/or vice versa, may be referred to as transduction.

In some embodiments, the electrodes (e.g., the primary electrode 680a and the secondary electrode 680b) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

In some configurations, the electrodes may be configured to stretch elastically. In such embodiments, the electrodes may include TCO nanoparticles, graphene, carbon nanotubes, PEDOT (poly[3,4-ethylenedioxythiophene] polystyrene sulfonate), and the like. In other embodiments, for example, embodiments where electroactive devices have electroactive polymer elements including nanovoided electroactive polymer materials, relatively rigid electrodes (e.g. electrodes including a metal such as aluminum) may be used.

In some embodiments, the electrodes (e.g., the primary electrode 680a and the secondary electrode 680b) may have a thickness of approximately 1 nm to approximately 1000 nm, with an example thickness of approximately 10 nm to approximately 50 nm. Some of the electrodes (e.g., the primary electrode 680a or the secondary electrode 680b) may be designed to allow healing of electrical breakdown (e.g., the electric breakdown of elastomeric polymer materials). In some embodiments, a thickness of an electrode that includes a self-healing electrode (e.g., an aluminum electrode) may be approximately 20 nm.

In some embodiments, the electrodes (e.g., the primary electrode 680a and the secondary electrode 680b) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, an ALD unit, and the like.

The methods and systems shown and described herein may be used to form electroactive devices having a single layer or multiple layers of a nanovoided electroactive polymer (e.g., a few layers to tens, hundreds, or thousands of stacked layers). For example, an electroactive device may include a stack of from two electroactive polymer elements and corresponding electrodes to thousands of electroactive polymer elements and corresponding electrodes (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large number of layers may be used to achieve a high displacement output, where the overall device displacement may be expressed as the sum of the displacement of each layer.

In some embodiments, the nanovoided polymeric thin film may include an elastomer material. In some embodiments, the electroactive polymer element (e.g., nanovoided polymeric thin film) may include an elastomer material that has an effective Poisson's ratio of less than approximately 0.35 and may include an auxetic material that has a negative Poisson's ratio. For instance, the elastomer material may have a Poisson's ratio of less than approximately 0.35 (e.g., 0.35, 0.3, 0.25, 0.2, 0.15, 0.1, 0.05, −0.05, −0.1, −0.15, −0.2, −0.25, −0.3, −0.35, or less, including ranges between any of the foregoing values). In some embodiments, the elastomer material may exhibit a compressive strain of at least approximately 10% when a voltage is applied between the primary electrode 680a and the secondary electrode 680b. In some embodiments, the electroactive polymer element 690 may have a thickness of approximately 10 nm to approximately 10 μm, with an example thickness of approximately 200 nm to approximately 500 nm.

Figure 7A:
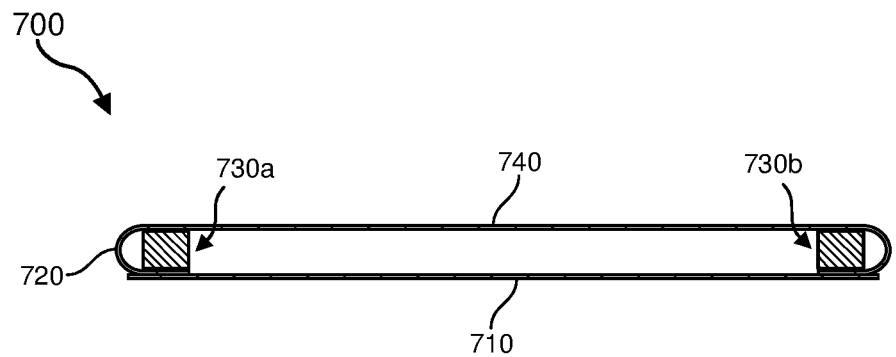
FIG. 7A is a cross-sectional view of an example deformable element and a lens assembly that may be used in connection with embodiments of this disclosure.

FIG. 7A shows a cross-sectional view of an example deformable element and a lens assembly which may include one or more electroactive devices described herein, in accordance with embodiments of the disclosure. As shown in FIG. 7A, adjustable lens 700 may be an adjustable lens with a structural support element 710 (e.g., a rigid backplane) and a deformable optical element 740. In some examples, a seal 720 may be formed between the structural support element 710 and the deformable optical element 740. In various embodiments, the adjustable lens may include any suitable type of lens with adjustable optical properties (e.g., adjustable optical power/focal length, correcting for wavefront distortion and/or aberrations, etc.). In some examples, adjustable lens 700 may be a liquid lens filled with an optical medium that is at least partially encapsulated by a deformable optical element (i.e., between structural support element 710 and deformable optical element 740). For example, lens 700 may be filled with a liquid or a semi-solid material (e.g., a gel, a semi-solid polymer, etc.). In general, lens 700 may contain a substantially transparent material that deforms and/or flows under pressure.

Structural support element 710 and deformable optical element 740 may be composed of any suitable materials. In some examples, structural support element 710 may include a rigid material. For example, structural support element 710 may be composed of a rigid, substantially transparent polymer. Deformable optical element 740 may include a substantially transparent and elastic material (e.g., a natural or synthetic elastomer) and may include one or more substantially transparent electroactive devices, such as electroactive device 600 in FIG. 6, as described herein. Such electroactive devices may cover at least a portion of a viewing region (i.e., a region that transmits light visible to a wearer) of deformable optical element 740, and in certain embodiments, may substantially cover the entire viewing region. In some examples, deformable optical element 740 may include at least one electroactive device having one or more nano-voided electroactive elements disposed between electrodes such that the at least one electroactive device is deformable (e.g., compressible, bendable, etc.) upon application of suitable voltages to the electrodes, resulting in deformation of deformable optical element 740 to produce a desired optical power or other optical property for lens 700. In at least one embodiment, deformation of deformable optical element 740 may additionally or alternatively be deformed using electroactive devices 730a and 730b (e.g., an actuator including an NVP material) disposed at peripheral regions of deformable optical element 740.

The lens 700 is illustrated in an unactuated state in FIG. 7A. Forces may be applied by electroactive device(s) in deformable optical element 740 to actuate the lens 700 by selectively deforming deformable optical element 740 (as will be described in connection with FIG. 7B). Further, in at least one example, forces may be applied by compression of electroactive devices 730a and/or 730b to deform and/or support deformation of peripheral portions of deformable optical element 740 to pull peripheral surfaces of optical element 740 into closer proximity with each other, thereby narrowing the space between the peripheral surfaces. The compressive forces applied by electroactive devices 730a and 730b may be uniform around a perimeter of lens 700 or may be variable around the perimeter of lens 700.

Figure 7B:
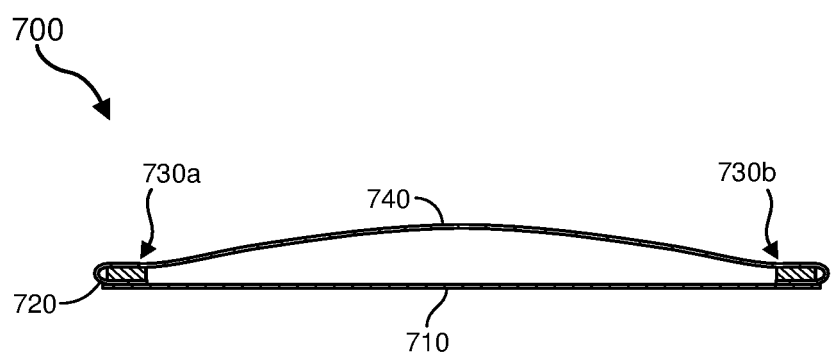
FIG. 7B is a cross-sectional view of the example deformable element and a lens assembly of FIG. 7A in an actuated state in accordance with embodiments of the disclosure.

FIG. 7B shows a cross-sectional view of the example deformable element and a lens assembly of FIG. 7A in an actuated state, in accordance with embodiments of the disclosure. In particular, FIG. 7B depicts adjustable lens 700 actuated by deformation of deformable optical element 740 due to deformation (e.g., compression, bending, etc.) of at least a portion of one or more electroactive devices in deformable optical element 740. In at least one example, a force may be applied by compression of electroactive devices 730a and/or 730b so as to deform and/or support deformation of perimeter regions of deformable optical element 740 at the perimeter of lens 700, thereby achieving a desired optical power or other optical property for the lens 700. Those skilled in the art will understand that other embodiments may use various combinations of compression and distension, with various numbers of electroactive devices and/or other force application elements (e.g., actuators) applying varying forces to various locations on a deformable optical element to achieve desired optical properties for the lens. The forces applied by the one or more electroactive devices of deformable optical element 740 in FIG. 7B to actuate the lens 700, as well as any other suitable forces, may be applied by any suitable type of electroactive device, such as that shown and described in connection with FIG. 6.

FIG. 8 shows a diagram of an example head mounted device (HMD), in accordance with example embodiments of the disclosure. In particular, the HMD may be a pair of glasses 800, such as augmented reality glasses. As shown, glasses 800 may include adjustable-focus lenses 804 coupled to a frame 806 (e.g., at an eyewire, not shown). In an embodiment, each of lenses 804 may include, for example, an optical fluid encapsulated by an elastomeric membrane and an optically clear and rigid back substrate. Actuation within lenses 804 (e.g., using one or more disclosed electroactive devices), and in some embodiments, actuation along the perimeter of lenses 804, may change the curvature (and thus the optical power) of the lenses. In an embodiment, a membrane surface may be non-planar (e.g., concave or convex) at rest (e.g., at zero electrical power). In one example, a membrane surface may be non-planar when a substrate is curved. Electroactive devices in lenses 804, and optionally, force application elements (e.g., actuators) mounted in frame 806 (e.g., in an eyewire), may deform each lens, with high optical quality achieved through tailored displacement and deflection. A control system (not shown) may trigger electroactive devices to adjust lenses 804.

In some embodiments, an NVP material, as disclosed herein, may be utilized in one or more optical components of glasses 800, such as electroactive devices for adjusting lenses 804, as described above in reference to FIGS. 7A and 7B. In some examples, a disclosed NVP material may be utilized as an optically transparent layer in lenses 804. Additionally or alternatively, an NVP material may be included in at least one other component of glasses 800, such as an optical component. For example, an NVP material layer may be included in one or more of an optical lens, waveguide, grating, collimator, combiner, reflector, prism, holographic component, antireflective component, and/or source display to direct light in a desired manner. In some embodiments, such an NVP material may have an effective refractive index or refractive index gradient, and in some examples, reflective, light-absorbing, and/or light dispersing attributes that are tailored based on a combination of bulk polymer materials, nanovoids, and interfacial layers to direct light passing through the NVP material in a desired manner. In at least one example, an NVP material of a component may be an electroactive material disposed between paired electrodes and configured to be deformed (e.g., compressed and/or expanded) in a manner similar to the disclosed electroactive devices (see, e.g., FIGS. 6-7B). Such deformation of the NVP material may modify various optical characteristics of an optical component including the NVP material by, for example, changing the refractive index, reflectivity, light absorbance, and/or light dispersing attributes of the NVP material as the sizes and/or shapes of the nanovoids in the NVP material are changed (e.g., reduced in size due to compression). In additional embodiments, electroactive devices, such as actuators, that include NVP materials, as disclosed herein, may be utilized in glasses 800 to adjust the position and/or orientation of at least one optical component, such as a lens, prism, and/or reflector.

FIG. 9 shows a flow diagram of an example method 900 for producing an NVP material in accordance with example embodiments of the disclosure. At step 910, a bulk polymer material (see, e.g., bulk polymer material 210, 310, 410, and 510 in FIGS. 2A-4, and 5B) defining a plurality of nanovoids (see, e.g., nanovoids 230, 330, 430, and 530 in FIGS. 2A-4, and 5B) may be formed, in accordance with embodiments disclosed herein.

In some embodiments, the method may further include preparing a mixture including a solvent and a curable component (see, e.g., FIGS. 5A, 5C, and 5D). In this example, the bulk polymer material may be formed at step 910 by (i) curing the curable component to form the bulk polymer material defining a plurality of solvent regions including the solvent, and (ii) removing at least a portion of the solvent from the plurality of solvent regions via a change in at least one of pressure or temperature to form the plurality of nanovoids (see, e.g., FIG. 5B). Preparing the mixture may include depositing the mixture by at least one of inkjet printing, chemical vapor deposition, vapor coating, spin coating, dip coating, spray coating, or extrusion.

In additional embodiments, the method may further include preparing a mixture including a curable component and a cavitation agent (e.g., a beta-keto acetic acid such as acetone dicarboxylic acid). In this example, the bulk polymer material may be formed at step 910 by (i) exposing the mixture to a form of actinic radiation (e.g., UV light, visible light, x-ray radiation, gamma radiation, electron beam radiation, etc.) sufficient to cure the curable component and decompose the cavitation agent to form the bulk polymer material defining a plurality of defined regions including the one or more decomposition products of the cavitation agent, and (ii) removing at least a portion of the one or more decomposition products from the plurality of defined regions to form the plurality of nanovoids (see, e.g., FIG. 5B).

At step 920 of method 900, an interfacial film of a plurality of interfacial films (see, e.g., interfacial films 220, 320, 420, and 520 in FIGS. 2A-4) may be formed at an interface between each of the plurality of nanovoids and the bulk polymer material, the interfacial film including one or more layers of material, in accordance with embodiments disclosed herein.

According to some embodiments, the interfacial film may be formed at step 920 by alternately diffusing each of a plurality of atomic layer deposition precursors through the bulk polymer material to adsorb layers of each of the plurality of atomic layer deposition precursors on inner surfaces of each of the plurality of nanovoids.

According to at least one embodiment, the method may further include preparing a mixture including at least one solvent, a first curable component, and a second curable component (see, e.g., FIGS. 5A, 5C, and 5D). In this example, the bulk polymer material may be formed by curing the first curable component. Additionally, the interfacial film may be formed by curing the second curable component. The first curable component may be cured prior to, during, and/or following curing of the second curable component. At least one of the first curable component or the second curable component may include at least one of an acrylate, an ether, an allyl glycidyl ether, an acrylamide, a polyamine, an isocyanate, a fatty acid, a fatty acid ester, a styrene, an epoxy, or a sulfur compound.

FIG. 10 shows a flow diagram of an example method 1000 for producing an NVP material in accordance with example embodiments of the disclosure. At step 1010, an emulsion may be prepared, the emulsion including a polymer-forming phase surrounding a dispersed phase that is distributed in a plurality of dispersed-phase regions, in accordance with embodiments disclosed herein (see, e.g., FIGS. 5A, 5C, and 5D).

According to some examples, preparing the emulsion at step 1010 may include forming the emulsion via at least one of phase inversion, cavitation, high-pressure homogenization, ultrasonication, or vapor condensation. In various embodiments, the emulsion may include at least one of a surfactant, a protein, and a lipid surrounding each of the plurality of dispersed-phase regions (see, e.g., FIG. 5D). In at least one example, the polymer-forming phase may include a solution of a solvent and a curable component. In this example, the dispersed phase may include a non-solvent that is insoluble in the solvent.

At step 1020 of method 1000, the polymer-forming phase may be cured to form a bulk polymer material surrounding the plurality of dispersed-phase regions (see, e.g., FIGS. 2A-4 and 5B-5D), in accordance with embodiments disclosed herein.

At step 1030 of method 1000, at least a portion of the dispersed phase may be removed from the plurality of dispersed-phase regions to form the plurality of nanovoids (see, e.g., FIGS. 2A-4 and 5B-5D), in accordance with embodiments disclosed herein.

At step 1040 of method 1000, an interfacial film of a plurality of interfacial films may be formed at an interface between each of the plurality of nanovoids and the bulk polymer material, the interfacial film including one or more layers of material (see, e.g., FIGS. 2A-4), in accordance with embodiments disclosed herein. In at least one example, the interfacial film may include a surfactant.

The disclosed NVP materials and corresponding devices, systems, and methods may provide various advantages over conventional polymer materials, as described herein. For example, the disclosed interfacial films may be utilized to enhance and/or otherwise adjust mechanical, electrical, thermal, optical, and/or gas diffusion characteristics of the NVP materials so as to improve the performance of the NVP materials in a variety of applications. In some examples, the interfacial layers may be utilized to form nanovoids having selected shapes, sizes, and/or interior void volumes and to enable incorporation of a greater range of materials, including particles, into the NVP materials. In at least one example, the disclosed NVP materials may include reactive species in the interfacial layers for use in chemical sensor, filtration, and/or reaction systems. Accordingly, the NVP materials may be tunable in a variety of ways to provide a desired characteristic or combination of characteristics suited to particular applications.

Electroactive Devices

In some applications, an electroactive device used in connection with the principles disclosed herein may include a first electrode, a second electrode, and an electroactive element disposed between the first electrode and the second electrode. The electroactive element may include an electroactive polymer, such as a disclosed NVP material, and a plurality of voids distributed within the electroactive polymer, for example as a porous polymer structure. Voids may be generally isolated from each other, or, at least in part, be interconnected through an open-cell structure. The plurality of voids may have a uniform or non-uniform distribution within the electroactive polymer, and the electroactive element may have a uniform or non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (for example, parallel to an applied electric field), change in curvature, or other change in a dimensional parameter, such as length, width, height, and the like, in one or more directions. An electroactive device may have a first deformation on application of a first voltage between the first and second electrodes, and a second deformation on application of a second voltage between the first and second electrodes, with the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied R.M.S. electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may be a component of a wearable device. The wearable device may include a helmet or other headwear, an eyewear frame, a glove, a belt, or any device configured to be positioned adjacent to or proximate the body of a wearer, for example to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, with the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device may be configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, wherein the electroactive response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, with the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, e.g., into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second plurality of electrodes. The first and second pluralities may alternate in a stacked configuration, so that each electroactive element is located between one of the first plurality of electrodes and one of the second plurality of electrodes. An electroactive device may include a plurality of stacked layers; for example, each layer may include an electroactive element disposed between a pair of electrodes. In some embodiments, an electrode may be shared between layers; for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions and the method may further include removing at least a portion of the at least one non-polymeric component from the cured elastomer material to form a nanovoided polymer material.

In some embodiments, an electroactive device may include an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations. An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may include an electroactive device, where the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example to provide a localized compound curvature.

In some embodiments, a sensor may include an electroactive device, where the electroactive device includes a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may include one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example proximate an edge. In some examples, the void volume fraction may have a lowest value in some portion of the electroactive element and increase from the lowest portion to portions with higher void volume fractions elsewhere, for example proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example having a length, width, and thickness, for example as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g. a distance from one side towards another side), a radial distance (e.g. a distance from a center or an edge of a disk-shaped form in a generally radial direction), or other distance measurement. In some embodiments, a volume void fraction may be a function of a distance parameter over a plurality of electroactive elements, for example including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system may include at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system may include at least one physical processor, a physical memory including computer-executable instructions that, when executed by the physical processor, cause the physical processor to receive an electrical signal from an electroactive device, and to process the electrical signal to obtain a deformation parameter of the electroactive device, wherein the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

Electroactive Elements

An electroactive element may include one or more NVP materials including electroactive polymers and may also include additional components. As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications. In some embodiments, electroactive elements described herein may include an NVP material including an elastomer having an effective Poisson's ratio of less than approximately 0.35 and an effective uncompressed density that is less than approximately 90% of the elastomer when densified.

As used herein, an "elastomer" may (in some examples) refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongate, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, an electroactive element may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

Nanovoided Materials

In some embodiments, the NVP materials described herein may include a plurality of voids, such as nanovoids. In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided materials. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of a material may be placed between two flat and rigid circular plates. In some embodiments, the diameter of the material being compressed may be at least 100 times the thickness the elastomer material. The diameter of the material may be measured, then the plates may be pressed together to exert a pressure of at least approximately 1×106 Pa on the material and the diameter of the material may be remeasured. The effective density may be determined from an expression (DR=D_uncompressed/D_compressed), where DR may represent the effective density ratio, D_uncompressed may represent the density of the uncompressed material, and D_compressed may represent the density of the compressed material.

The density of voids within a nanovoided material may vary as a function of position. In some embodiments, the volume fraction of a nanovoided material may vary between 10% and 60%. The structure of the voids may be interconnected (open cell) or the voids may be fully enclosed by the bulk matrix material (closed cell). The voids may be partially filled with a liquid or gas, such as air. The voids may be partially coated with a layer of suitable material. In some embodiments, a nanovoided material may be fabricated using a templating agent, such as a material that directs the structural formation of pores or other structural elements of the nanovoided material. A templating agent may be any phase of matter (solid, liquid, gas). In some embodiments, a templating agent is removed to produce a void.

Particles

In some embodiments, the NVP materials described herein may include particles including a material having a high dielectric constant, with the particles having an average diameter between approximately 10 nm and approximately 1000 nm. In some embodiments, the material having the high dielectric constant may include barium titanate.

In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate (BaTiO3), or other perovskite material such as other titanates.

Additionally or alternatively, any other suitable component may be added to the electroactive polymer material.

BaTiO3 is a ferroelectric material with a relatively high dielectric constant (e.g., a value of between approximately 500 and approximately 7000) and polarization and may be used in various electroactive devices described herein. Besides large polarizability and permittivity, large strains may also be achievable with BaTiO3. Pure BaTiO3 is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, e.g., by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example a dielectric liquid or a dielectric gas with high dielectric strength gas, such as a halide, in particular a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode 115, or any other electrode) may include a metal such as aluminum, gold, silver, tin, copper, indium, gallium, zinc, and the like. An electrode may include one or more electrically conductive materials, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, e.g., through a contact layer, to a common electrode. In some embodiments, an electroactive device may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, an electroactive device may include additional electroactive elements interleaved between electrodes, for example in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of an electroactive device during operation.

Electrode Fabrication

In some embodiments, the electrodes described herein (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assembly and Optical Systems

In some embodiments, the optical elements described herein may include or be mechanically coupled to one or more optical elements. An optical element may include a lens, mirror, prism, holographic element, beam splitter, optical filter, diffraction grating, a display, or other optical element. In some embodiments, an optical element may be coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and/or elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems). In some embodiments, a lens assembly may include multiple deformable optical elements (e.g., multiple deformable lenses, such as liquid lenses).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices, in accordance with example embodiments of the disclosure.

Methods of Device Fabrication

Various fabrication methods are discussed herein. Properties of the NVP material may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an nanovoided material.

Methods of forming a nanovoided material include forming layers sequentially (e.g., via vapor deposition, coating, printing, etc.) or simultaneously (e.g., via co-flowing, coextrusion, slot die coating, etc.). Alternatively, the nanovoided materials may be deposited using initiated chemical vapor deposition (iCVD), where, for example, suitable monomers of the desired polymers may be used to form the desired coating. In some embodiments, monomers, oligomers, and/or prepolymers for forming the nanovoided materials may optionally be mixed with a solvent and the solvent may be removed from the nanovoided materials during and/or following curing to form nanovoids within the nanovoided materials.

In some embodiments, an inlet to a deposition chamber may open and may input an appropriate monomer initiator for starting a chemical reaction. In some embodiments, "monomer," as used herein, may refer to a monomer that forms a given polymer (i.e., as part of a nanovoided material). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable materials may be cured with a source of radiation (e.g., electromagnetic radiation, such as UV and/or visible light) to form a nanovoided material that includes a cured elastomer material. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form a nanovoided material. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured material may include at least one non-polymeric component in a plurality of defined regions and a method may further include removing at least a portion of the at least one non-polymeric component from the cured elastomer material to form a voided (e.g., nanovoided) polymer element.

In some embodiments, the deposition of materials (e.g., monomers, oligomers, monomer initiators, conductive materials, etc.) of a nanovoided material may be performed using a deposition process, such as CVD. CVD may refer to a vacuum deposition method used to produce high-quality, high-performance, solid materials. In CVD, a substrate may be exposed to one or more precursors, which may react and/or decompose on the substrate surface to produce the desired deposit. Frequently, volatile by-products are also produced, which may be removed by gas flow through the chamber.

In some embodiments, a nanovoided material may be fabricated using an atmospheric pressure CVD (APCVD) coating formation technique (e.g., CVD at atmospheric pressure). In some embodiments, a nanovoided material may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately 10-6 Pa (equivalently, approximately 10-8 torr)).

In some embodiments, a nanovoided material may be fabricated using an aerosol assisted CVD (AACVD) process (e.g., a CVD in which the precursors are transported) by means of a liquid/gas aerosol, which may be generated ultrasonically or with electrospray. In some embodiments, AACVD may be used with non-volatile precursors. In some embodiments, a nanovoided material may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to form the nanovoided material as in CVD. DLICVD may be used on liquid or solid precursors, and high growth rates for the deposited materials may be reached using this technique.

In some embodiments, a nanovoided material may be fabricated using a hot wall CVD process (e.g., CVD in which the deposition chamber is heated by an external power source and the nanovoided material or precursor mixture is heated by radiation from the heated wall of the deposition chamber). In another aspect, a nanovoided material may be fabricated using a cold wall CVD process (e.g., a CVD in which only the nanovoided material or precursor mixture is directly heated, for example, by induction, while the walls of the chamber are maintained at room temperature).

In some embodiments, a nanovoided material may be fabricated using a microwave plasma-assisted CVD (MPCVD) process, where microwaves are used to enhance chemical reaction rates of the precursors. In another aspect, a nanovoided material may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the nanovoided material or in depositing certain materials (e.g., organic materials and/or some polymers).

In some embodiments, a nanovoided material may be fabricated using a remote plasma-enhanced CVD (RPECVD) process. In some embodiments, RPECVD may be similar to PECVD except that the nanovoided material or precursor may not be directly in the plasma discharge region. In some embodiments, the removal of the nanovoided material from the plasma region may allow for the reduction of processing temperatures down to room temperature.

In some embodiments, a nanovoided material may be fabricated using an atomic-layer CVD (ALCVD) process. In some embodiments, ALCVD may deposit successive layers of different substances to produce layered, crystalline film coatings on the nanovoided material.

In some embodiments, a nanovoided material may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the nanovoided material.

In some embodiments, a nanovoided material may be fabricated using a hot filament CVD (HFCVD) process, which may also be referred to as catalytic CVD (cat-CVD) or initiated CVD (iCVD). In some embodiments, this process may use a hot filament to chemically decompose the source gases to form components of the nanovoided material. Moreover, the filament temperature and temperature of portions of the nanovoided material or precursors may be independently controlled, allowing colder temperatures for better adsorption rates at the location of the nanovoided material or precursors, and higher temperatures necessary for decomposition of precursors to free radicals at the filament.

In some embodiments, a nanovoided material may be fabricated using a hybrid physical-chemical vapor deposition (HPCVD) process. HPCVD may involve both chemical decomposition of precursor gas and vaporization of a solid source to form the nanovoided material.

In some embodiments, a nanovoided material may be fabricated using a rapid thermal CVD (RTCVD) process. This CVD process uses heating lamps or other methods to rapidly heat the nanovoided material. Heating only the nanovoided material rather than the precursors or chamber walls may reduce unwanted gas-phase reactions that may lead to particle formation in the nanovoided material.

In some embodiments, a nanovoided material may be fabricated using a photo-initiated CVD (PICVD) process. This process may use UV light to stimulate chemical reactions in the precursor materials used to form the nanovoided material. Under certain conditions, PICVD may be operated at or near atmospheric pressure.

In some embodiments, nanovoided materials may be fabricated by depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, nanovoids may be formed in the nanovoided material. In some embodiments, a flowable material (e.g., a solvent) may be combined with the curable materials (e.g., monomers and conductive materials) to create a flowable mixture that may be used for producing nanovoided materials. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, a flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component. Alternatively, the flowable material (e.g., solvent) may be introduced into a vaporizer to deposit (e.g., via vaporization or, in alternative embodiments, via printing) a curable material onto a substrate. In some embodiments, a flowable material (e.g., solvent) may be deposited as a separate layer either on top or below a curable material (e.g., a monomer) and the solvent and curable material may be allowed to diffuse into each other before being cured by the source of radiation to generate a nanovoided material. In some embodiments, after the curable material is cured, the solvent may be allowed to evaporate before further processing. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate. In some embodiments, a system may include multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

Application to Artificial Reality Systems

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1100 in FIG. 11. Other artificial reality systems may include a NED that also provides visibility into the real world (e.g., augmented-reality system 1200 in FIG. 12) or that visually immerses a user in an artificial reality (e.g., virtual-reality system 1300 in FIG. 13). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
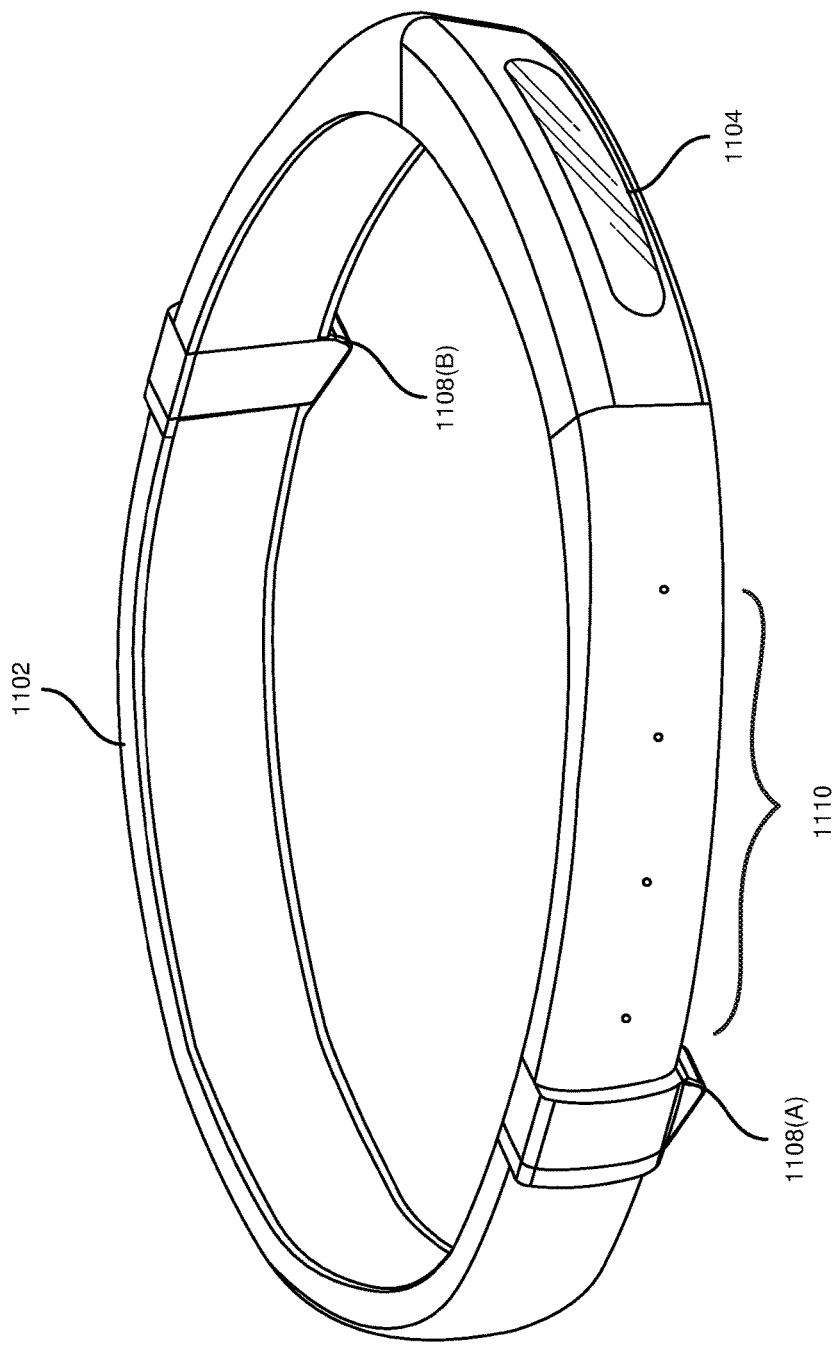
FIG. 11 is an illustration of an example artificial-reality headband that may be used in connection with embodiments of this disclosure.

Turning to FIG. 11, augmented-reality system 1100 generally represents a wearable device dimensioned to fit about a body part (e.g., a head) of a user. As shown in FIG. 11, system 1100 may include a frame 1102 and a camera assembly 1104 that is coupled to frame 1102 and configured to gather information about a local environment by observing the local environment. Augmented-reality system 1100 may also include one or more audio devices, such as output audio transducers 1108(A) and 1108(B) and input audio transducers 1110. Output audio transducers 1108(A) and 1108(B) may provide audio feedback and/or content to a user, and input audio transducers 1110 may capture audio in a user's environment.

As shown, augmented-reality system 1100 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1100 may not include a NED, augmented-reality system 1100 may include other types of screens or visual feedback devices (e.g., a display screen integrated into a side of frame 1102).

Figure 12:
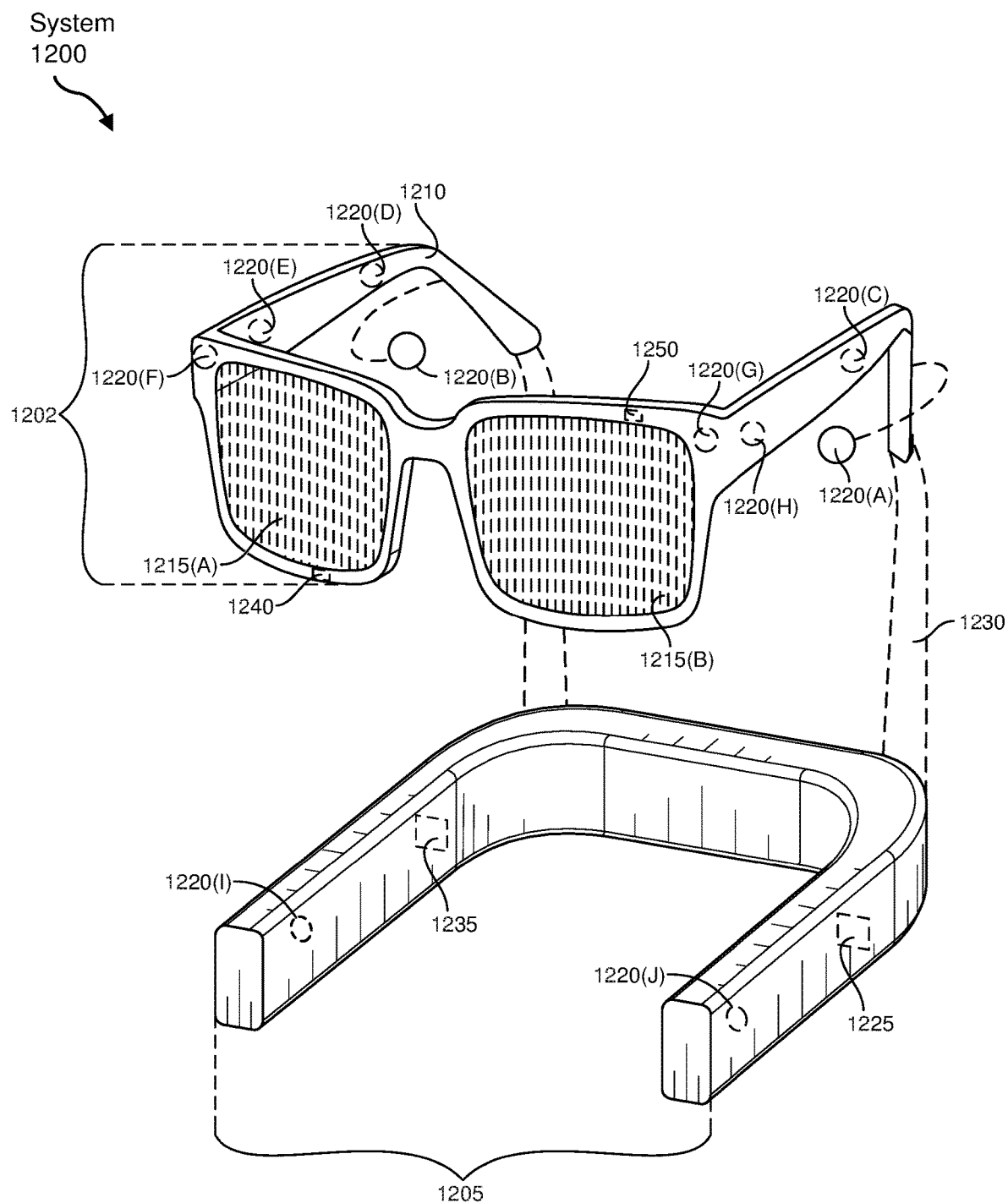
FIG. 12 is an illustration of example augmented-reality glasses that may be used in connection with embodiments of this disclosure.

The embodiments discussed in this disclosure may also be implemented in augmented-reality systems that include one or more NEDs. For example, as shown in FIG. 12, augmented-reality system 1200 may include an eyewear device 1202 with a frame 1210 configured to hold a left display device 1215(A) and a right display device 1215(B) in front of a user's eyes. Display devices 1215(A) and 1215(B) may act together or independently to present an image or series of images to a user. While augmented-reality system 1200 includes two displays, embodiments of this disclosure may be implemented in augmented-reality systems with a single NED or more than two NEDs.

In some embodiments, augmented-reality system 1200 may include one or more sensors, such as sensor 1240. Sensor 1240 may generate measurement signals in response to motion of augmented-reality system 1200 and may be located on substantially any portion of frame 1210. Sensor 1240 may represent a position sensor, an inertial measurement unit (IMU), a depth camera assembly, or any combination thereof. In some embodiments, augmented-reality system 1200 may or may not include sensor 1240 or may include more than one sensor. In embodiments in which sensor 1240 includes an IMU, the IMU may generate calibration data based on measurement signals from sensor 1240. Examples of sensor 1240 may include, without limitation, accelerometers, gyroscopes, magnetometers, other suitable types of sensors that detect motion, sensors used for error correction of the IMU, or some combination thereof.

Augmented-reality system 1200 may also include a microphone array with a plurality of acoustic transducers 1220(A)-1220(J), referred to collectively as acoustic transducers 1220. Acoustic transducers 1220 may be transducers that detect air pressure variations induced by sound waves. Each acoustic transducer 1220 may be configured to detect sound and convert the detected sound into an electronic format (e.g., an analog or digital format). The microphone array in FIG. 12 may include, for example, ten acoustic transducers: 1220(A) and 1220(B), which may be designed to be placed inside a corresponding ear of the user, acoustic transducers 1220(C), 1220(D), 1220(E), 1220(F), 1220(G), and 1220(H), which may be positioned at various locations on frame 1210, and/or acoustic transducers 1220(1) and 1220(J), which may be positioned on a corresponding neckband 1205.

In some embodiments, one or more of acoustic transducers 1220(A)-(F) may be used as output transducers (e.g., speakers). For example, acoustic transducers 1220(A) and/or 1220(B) may be earbuds or any other suitable type of headphone or speaker.

The configuration of acoustic transducers 1220 of the microphone array may vary. While augmented-reality system 1200 is shown in FIG. 12 as having ten acoustic transducers 1220, the number of acoustic transducers 1220 may be greater or less than ten. In some embodiments, using higher numbers of acoustic transducers 1220 may increase the amount of audio information collected and/or the sensitivity and accuracy of the audio information. In contrast, using a lower number of acoustic transducers 1220 may decrease the computing power required by the controller 1250 to process the collected audio information. In addition, the position of each acoustic transducer 1220 of the microphone array may vary. For example, the position of an acoustic transducer 1220 may include a defined position on the user, a defined coordinate on frame 1210, an orientation associated with each acoustic transducer, or some combination thereof.

Acoustic transducers 1220(A) and 1220(B) may be positioned on different parts of the user's ear, such as behind the pinna or within the auricle or fossa. Or, there may be additional acoustic transducers on or surrounding the ear in addition to acoustic transducers 1220 inside the ear canal. Having an acoustic transducer positioned next to an ear canal of a user may enable the microphone array to collect information on how sounds arrive at the ear canal. By positioning at least two of acoustic transducers 1220 on either side of a user's head (e.g., as binaural microphones), augmented-reality device 1200 may simulate binaural hearing and capture a 3D stereo sound field around about a user's head. In some embodiments, acoustic transducers 1220(A) and 1220(B) may be connected to augmented-reality system 1200 via a wired connection 1230, and in other embodiments, acoustic transducers 1220(A) and 1220(B) may be connected to augmented-reality system 1200 via a wireless connection (e.g., a Bluetooth connection). In still other embodiments, acoustic transducers 1220(A) and 1220(B) may not be used at all in conjunction with augmented-reality system 1200.

Acoustic transducers 1220 on frame 1210 may be positioned along the length of the temples, across the bridge, above or below display devices 1215(A) and 1215(B), or some combination thereof. Acoustic transducers 1220 may be oriented such that the microphone array is able to detect sounds in a wide range of directions surrounding the user wearing the augmented-reality system 1200. In some embodiments, an optimization process may be performed during manufacturing of augmented-reality system 1200 to determine relative positioning of each acoustic transducer 1220 in the microphone array.

In some examples, augmented-reality system 1200 may include or be connected to an external device (e.g., a paired device), such as neckband 1205. Neckband 1205 generally represents any type or form of paired device. Thus, the following discussion of neckband 1205 may also apply to various other paired devices, such as charging cases, smart watches, smart phones, wrist bands, other wearable devices, hand-held controllers, tablet computers, laptop computers and other external compute devices, etc.

As shown, neckband 1205 may be coupled to eyewear device 1202 via one or more connectors. The connectors may be wired or wireless and may include electrical and/or non-electrical (e.g., structural) components. In some cases, eyewear device 1202 and neckband 1205 may operate independently without any wired or wireless connection between them. While FIG. 12 illustrates the components of eyewear device 1202 and neckband 1205 in example locations on eyewear device 1202 and neckband 1205, the components may be located elsewhere and/or distributed differently on eyewear device 1202 and/or neckband 1205. In some embodiments, the components of eyewear device 1202 and neckband 1205 may be located on one or more additional peripheral devices paired with eyewear device 1202, neckband 1205, or some combination thereof. Furthermore, Pairing external devices, such as neckband 1205, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1200 may be provided by a paired device or shared between a paired device and an eyewear device, thus reducing the weight, heat profile, and form factor of the eyewear device overall while still retaining desired functionality. For example, neckband 1205 may allow components that would otherwise be included on an eyewear device to be included in neckband 1205 since users may tolerate a heavier weight load on their shoulders than they would tolerate on their heads. Neckband 1205 may also have a larger surface area over which to diffuse and disperse heat to the ambient environment. Thus, neckband 1205 may allow for greater battery and computation capacity than might otherwise have been possible on a stand-alone eyewear device. Since weight carried in neckband 1205 may be less invasive to a user than weight carried in eyewear device 1202, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1205 may be communicatively coupled with eyewear device 1202 and/or to other devices. These other devices may provide certain functions (e.g., tracking, localizing, depth mapping, processing, storage, etc.) to augmented-reality system 1200. In the embodiment of FIG. 12, neckband 1205 may include two acoustic transducers (e.g., 1220(1) and 1220(J)) that are part of the microphone array (or potentially form their own microphone subarray). Neckband 1205 may also include a controller 1225 and a power source 1235.

Acoustic transducers 1220(1) and 1220(J) of neckband 1205 may be configured to detect sound and convert the detected sound into an electronic format (analog or digital). In the embodiment of FIG. 12, acoustic transducers 1220(1) and 1220(J) may be positioned on neckband 1205, thereby increasing the distance between the neckband acoustic transducers 1220(1) and 1220(J) and other acoustic transducers 1220 positioned on eyewear device 1202. In some cases, increasing the distance between acoustic transducers 1220 of the microphone array may improve the accuracy of beamforming performed via the microphone array. For example, if a sound is detected by acoustic transducers 1220(C) and 1220(D) and the distance between acoustic transducers 1220(C) and 1220(D) is greater than, e.g., the distance between acoustic transducers 1220(D) and 1220(E), the determined source location of the detected sound may be more accurate than if the sound had been detected by acoustic transducers 1220(D) and 1220(E).

Controller 1225 of neckband 1205 may process information generated by the sensors on 1205 and/or augmented-reality system 1200. For example, controller 1225 may process information from the microphone array that describes sounds detected by the microphone array. For each detected sound, controller 1225 may perform a direction-of-arrival (DOA) estimation to estimate a direction from which the detected sound arrived at the microphone array. As the microphone array detects sounds, controller 1225 may populate an audio data set with the information. In embodiments in which augmented-reality system 1200 includes an inertial measurement unit, controller 1225 may compute all inertial and spatial calculations from the IMU located on eyewear device 1202. A connector may convey information between augmented-reality system 1200 and neckband 1205 and between augmented-reality system 1200 and controller 1225. The information may be in the form of optical data, electrical data, wireless data, or any other transmittable data form. Moving the processing of information generated by augmented-reality system 1200 to neckband 1205 may reduce weight and heat in eyewear device 1202, making it more comfortable to the user.

Power source 1235 in neckband 1205 may provide power to eyewear device 1202 and/or to neckband 1205. Power source 1235 may include, without limitation, lithium ion batteries, lithium-polymer batteries, primary lithium batteries, alkaline batteries, or any other form of power storage. In some cases, power source 1235 may be a wired power source. Including power source 1235 on neckband 1205 instead of on eyewear device 1202 may help better distribute the weight and heat generated by power source 1235.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1300 in FIG. 13, that mostly or completely covers a user's field of view. Virtual-reality system 1300 may include a front rigid body 1302 and a band 1304 shaped to fit around a user's head. Virtual-reality system 1300 may also include output audio transducers 1306(A) and 1306(B). Furthermore, while not shown in FIG. 13, front rigid body 1302 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1300 and/or virtual-reality system 1300 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1200 and/or virtual-reality system 1300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1100, augmented-reality system 1200, and/or virtual-reality system 1300 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 11 and 13, output audio transducers 1108(A), 1108(B), 1306(A), and 1306(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1110 may include condenser microphones, dynamic microphones, ribbon microphones, and/or any other type or form of input transducer. In some embodiments, a single transducer may be used for both audio input and audio output.

Figure 13:
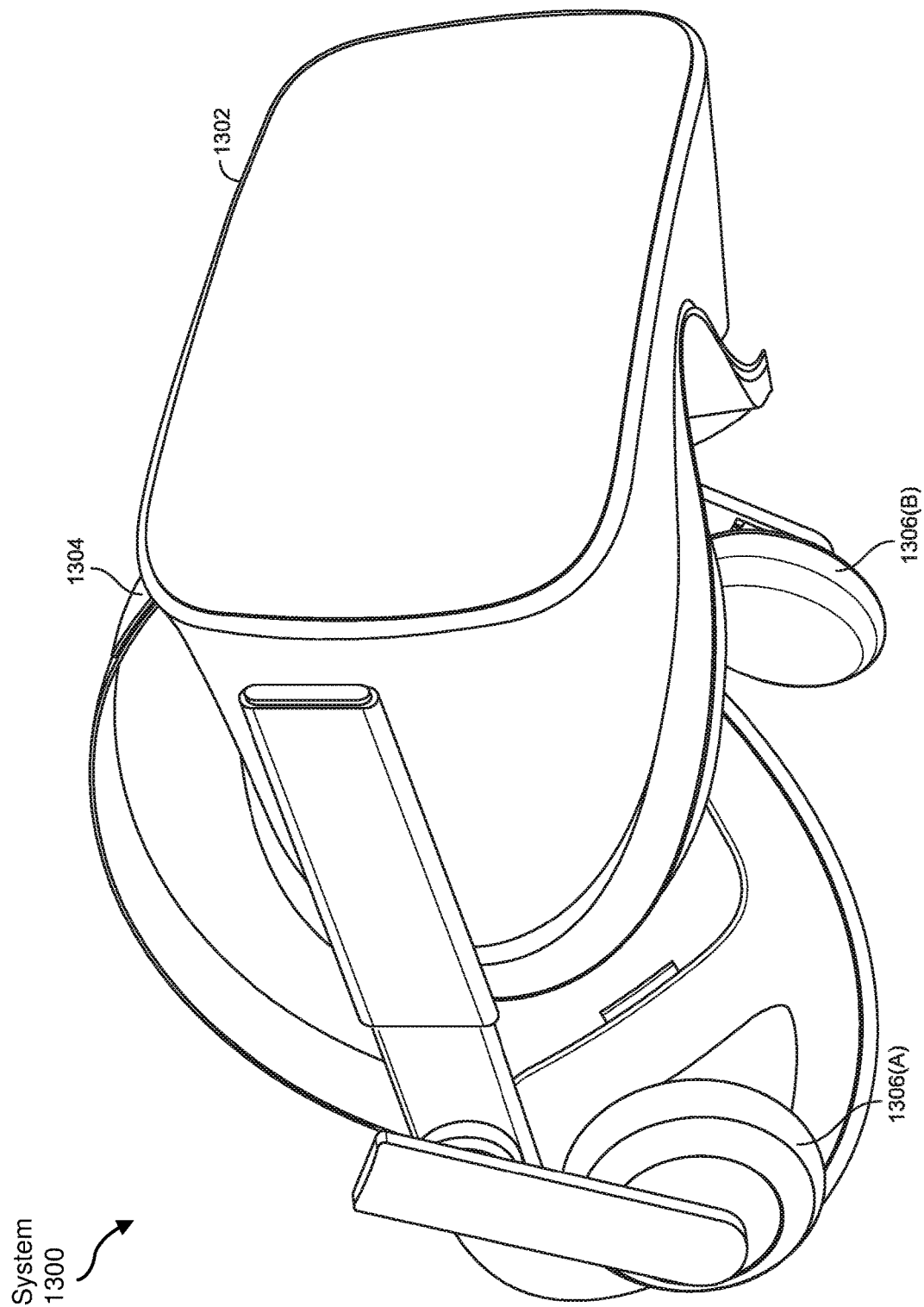
FIG. 13 is an illustration of an example virtual-reality headset that may be used in connection with embodiments of this disclosure.

While not shown in FIGS. 11-13, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 1100, 1200, and 1300 may be used with a variety of other types of devices to provide a more compelling artificial reality experience. These devices may be haptic interfaces with transducers that provide haptic feedback and/or that collect haptic information about a user's interaction with an environment. In various embodiments, haptic interfaces may include electroactive devices (see, e.g., FIGS. 6-8), such as electroactive transducers or actuators, that include NVP materials as described herein (see, e.g., FIGS. 1-6). The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 14:
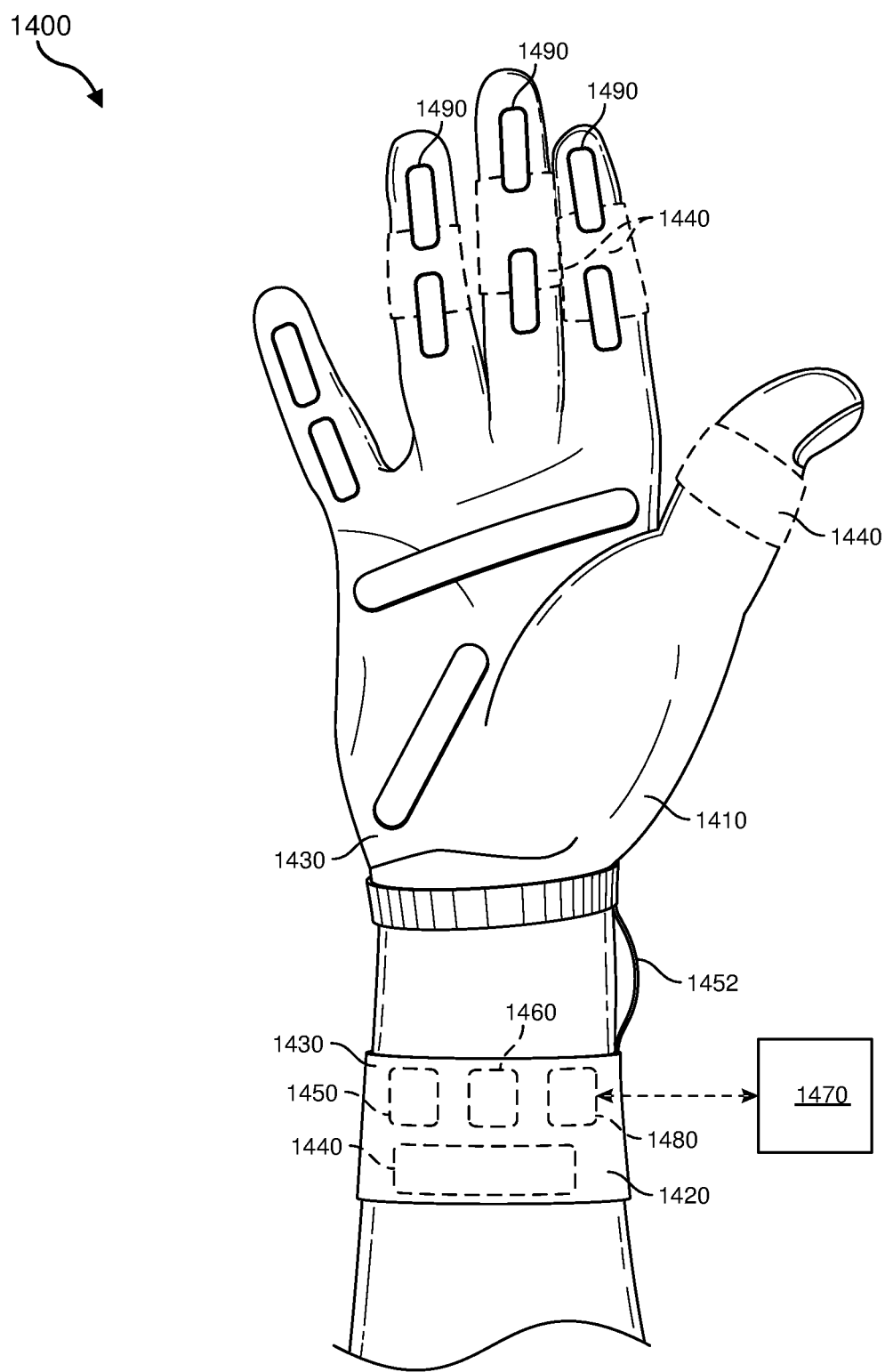
FIG. 14 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 14 illustrates a vibrotactile system 1400 in the form of a wearable glove (haptic device 1410) and wristband (haptic device 1420). Haptic device 1410 and haptic device 1420 are shown as examples of wearable devices that include a flexible, wearable textile material 1430 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, nonwoven fabric, leather, cloth, a flexible polymer material, composite materials, etc.

One or more vibrotactile devices 1440 may be positioned at least partially within one or more corresponding pockets formed in textile material 1430 of vibrotactile system 1400. Vibrotactile devices 1440 may be positioned in locations to provide a vibrating sensation (e.g., haptic feedback) to a user of vibrotactile system 1400. For example, vibrotactile devices 1440 may be positioned to be against the user's finger(s), thumb, or wrist, as shown in FIG. 14. Vibrotactile devices 1440 may, in some examples, be sufficiently flexible to conform to or bend with the user's corresponding body part(s).

A power source 1450 (e.g., a battery) for applying a voltage to the vibrotactile devices 1440 for activation thereof may be electrically coupled to vibrotactile devices 1440, such as via conductive wiring 1452. In some examples, each of vibrotactile devices 1440 may be independently electrically coupled to power source 1450 for individual activation. In some embodiments, a processor 1460 may be operatively coupled to power source 1450 and configured (e.g., programmed) to control activation of vibrotactile devices 1440.

Vibrotactile system 1400 may be implemented in a variety of ways. In some examples, vibrotactile system 1400 may be a standalone system with integral subsystems and components for operation independent of other devices and systems. As another example, vibrotactile system 1400 may be configured for interaction with another device or system 1470. For example, vibrotactile system 1400 may, in some examples, include a communications interface 1480 for receiving and/or sending signals to the other device or system 1470. The other device or system 1470 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1480 may enable communications between vibrotactile system 1400 and the other device or system 1470 via a wireless (e.g., Wi-Fi, Bluetooth, cellular, radio, etc.) link or a wired link. If present, communications interface 1480 may be in communication with processor 1460, such as to provide a signal to processor 1460 to activate or deactivate one or more of the vibrotactile devices 1440.

Vibrotactile system 1400 may optionally include other subsystems and components, such as touch-sensitive pads 1490, pressure sensors, motion sensors, position sensors, lighting elements, and/or user interface elements (e.g., an on/off button, a vibration control element, etc.). During use, vibrotactile devices 1440 may be configured to be activated for a variety of different reasons, such as in response to the user's interaction with user interface elements, a signal from the motion or position sensors, a signal from the touch-sensitive pads 1490, a signal from the pressure sensors, a signal from the other device or system 1470, etc.

Although power source 1450, processor 1460, and communications interface 1480 are illustrated in FIG. 14 as being positioned in haptic device 1420, the present disclosure is not so limited. For example, one or more of power source 1450, processor 1460, or communications interface 1480 may be positioned within haptic device 1410 or within another wearable textile.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A nanovoided polymer material comprising:
   a bulk polymer material defining a plurality of nanovoids; and
   an interfacial film disposed at an interface between each of the plurality of nanovoids and the bulk polymer material, each interfacial film comprising:
      a first layer surrounding a corresponding nanovoid of the plurality of nanovoids; and
      a second layer disposed between the first layer and the bulk polymer material, the second layer comprising at least one of a surfactant or a lipid bilayer.

2. The nanovoided polymer material of claim 1, wherein the first layer of the interfacial film comprises a material that differs from the bulk polymer material.

3. The nanovoided polymer material of claim 1, wherein each of the plurality of nanovoids is spherical or anisotropic in shape.

4. The nanovoided polymer material of claim 1, wherein at least one of the bulk polymer material or the first layer of the interfacial film comprises at least one of a silicon-based polymer, an acrylic polymer, an epoxy polymer, a polyurethane polymer, a styrene-based polymer, or a polyamine-based polymer.

5. The nanovoided polymer-based material of claim 1, wherein the interfacial film comprises at least one of a metal, an oxide, a nitride, a fluorocarbon, or a fluorophore.

6. The nanovoided polymer-based material of claim 1, wherein a porosity of the nanovoided polymer material is between 0% and approximately 75%.

7. The nanovoided polymer-based material of claim 1, wherein at least one of the bulk polymer material or the interfacial film comprises a nanocomposite including nanoparticles embedded in a polymer.

* * * * *